(12) United States Patent
Nakamura

(10) Patent No.: US 6,472,703 B1
(45) Date of Patent: *Oct. 29, 2002

(54) SEMICONDUCTOR MEMORY DEVICE AND METHOD FOR FABRICATING THE SAME

(75) Inventor: Shunji Nakamura, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 55 days.

(21) Appl. No.: 08/970,212

(22) Filed: Nov. 14, 1997

Related U.S. Application Data

(62) Division of application No. 08/660,324, filed on Jun. 4, 1996, now Pat. No. 5,776,789.

(30) Foreign Application Priority Data

Jun. 5, 1995 (JP) .............................................. 7-137968

(51) Int. Cl.[7] ............................................ H01L 27/108
(52) U.S. Cl. ........................ 257/304; 257/301; 257/302
(58) Field of Search ........................... 257/297, 301–305

(56) References Cited

U.S. PATENT DOCUMENTS

| | | | | |
|---|---|---|---|---|
| 5,057,888 A | * | 10/1991 | Fazan et al. | 257/304 |
| 5,060,034 A | * | 10/1991 | Shimizu et al. | 257/314 |
| 5,102,819 A | * | 4/1992 | Matsushita et al. | 438/52 |
| 5,424,235 A | * | 6/1995 | Nishihara | 438/253 |
| 5,442,584 A | * | 8/1995 | Jeong et al. | 257/301 |
| 5,493,137 A | * | 2/1996 | Satoh et al. | 257/296 |
| 5,519,236 A | * | 5/1996 | Ozaki | 257/302 |
| 5,661,320 A | * | 8/1997 | Moriya | 257/296 |
| 5,895,946 A | * | 4/1999 | Hamamoto et al. | 257/302 |

FOREIGN PATENT DOCUMENTS

| | | |
|---|---|---|
| JP | 6-275803 | 9/1994 |
| JP | 6-283683 | 10/1994 |
| JP | 7-86296 | 3/1995 |

* cited by examiner

Primary Examiner—Tom Thomas
Assistant Examiner—Ori Nadav
(74) Attorney, Agent, or Firm—Armstrong, Westerman, Hattori, McLeland & Naughton, LLP

(57) ABSTRACT

A semiconductor memory device comprises a silicon layer having a first diffused region and a second diffused region formed therein, a gate electrode formed through an insulating film on one side of the silicon layer between the first and the second diffused regions, a capacitor formed on said one side of the silicon layer and having a storage electrode connected to the first diffused region, and a bit line formed on the other side of the silicon layer and connected to the second diffused region, whereby a semiconductor memory device of SOI structure can be easily fabricated. The bit line connected to the second diffused region is formed on the other side of the semiconductor layer, whereby the bit line can be arranged without restriction by the structure, etc. of the capacitor. Short circuit between the capacitor and the bit line can be prevented.

4 Claims, 39 Drawing Sheets

SEMICONDUCTOR MEMORY DEVICE AND METHOD FOR FABRICATING THE SAME

This is a divisional of application Ser. No. 08/660,324 filed Jun. 4, 1996 now U.S. Pat. No. 5,776,789.

BACKGROUND OF THE INVENTION

The present invention relates to a semiconductor memory device, more specifically to a semiconductor memory device and a method for fabricating the same which can fabricate a DRAM (Dynamic Random Access Memory) of high integration and high efficiency at low costs.

A DRAM is a semiconductor device which may comprise one transistor and one capacitor, and its structures and methods for fabricating the structures have been conventionally studied for fabricating semiconductor devices of high density, high integration and high efficiency.

To achieve higher integration of a DRAM, it is effective to make the capacitor area smaller. The capacitance reduction accompanies soft error resistance degradation. This is a disadvantage. Lower electric power consumption of the device as well as higher integration has achieved, but the electric power consumption reduction makes the junction capacitance of the device more influential, which is a barrier to higher speed operation of the device.

As effective means to solve these disadvantages, a method for fabricating a DRAM using an SOI (Semiconductor On Insulator) substrate in place of the conventional silicon substrate has been proposed.

By applying the SOI structure to a DRAM, perfect isolation between devices can be made possible, and the soft error immunity and latch-up resistance can be much improved. The junction area can be reduced, and high speed operation at low electric power consumption can be made possible. Furthermore, the soft error immunity can be thus improved, which allows a smaller capacitance. The capacitor forming process can be accordingly simplified.

Also proposed has been the so-called bonded SOI technique in which another substrate is adhered to a surface of a silicon substrate with an insulating portion formed on, which is on the side of the insulating portion, and the silicon substrate is polished to form a semiconductor layer on the insulating portion. A DRAM using this bonded SOI technique is disclosed in Japanese Patent Laid-Open Publication No. Tokkaihei 04-225276/1992 and Japanese Patent Laid-Open Publication No. Tokkaihei 06-104410/1994.

The DRAM using the above-described conventional SOI structure can simplify the capacitor forming process to thereby decrease costs, but cost increase due to the use of the SOI structure exceeds the cost decrease, sometimes with the result of higher fabrication costs.

In devices using the above-described conventional SOI structure, the devices are fabricated after the SOI substrate is formed. The substrate is subjected to all heat treatments for forming the devices. Because SOI substrates are usually more susceptible of heat treatments than the usual substrates, the wafers are easily deformed, and crystal defects are easily introduced. As a result, the fabrication yields are often low.

In the DRAM using the above-described SOI structure, for the purpose of reducing this disadvantage as much as possible, a material having a thermal diffusion coefficient equal to that of the SOI layer supported on the support substrate, e.g., a semiconductor substrate of the same single crystal as the SOI layer, must be used. This often adds to fabrication costs of the DRAM.

In the bonded SOI, devices are formed on the SOI layer which is adhered thereto the substrate and polished. Accordingly it is necessary to finish the polished surface in a speculum of high precision. The polishing step often adds to fabrication costs.

To form the usual SOI substrate, the polishing step of planarizing a surface of a semiconductor substrate before the substrate is adhered to, and the polishing step of polishing the adhered semiconductor substrate to a thin film to form the SOI layer are necessary. This often adds to fabrication costs.

The use of the SOI structure makes it difficult to apply back bias to the channel regions of transistors, and the source-drain voltage resistance is often degraded due to charges accumulated in the back gates.

To prevent erroneous operation of memories, it is effective to cover the bit lines with shield electrodes. In the conventional DRAM structure, however, a number of lines and capacitors are formed on the bit line, which makes it difficult to cover the bit lines with the shield electrodes.

The above-described disadvantages make it difficult to form memories of high soft error immunity and reliability, which makes it accordingly difficult to reduce the capacitance to thereby simplify the fabrication process.

An object of the present invention is to provide a semiconductor memory device structure which permits a semiconductor memory device including the SOI structure to be fabricated at low costs without fabrication yield decrease, and a method for fabricating the same.

SUMMARY OF THE INVENTION

The above-described object is achieved by a semiconductor memory device comprising: a silicon layer having a first diffused region and a second diffused region formed therein; a gate electrode formed through an insulating film on one side of the silicon layer between the first and the second diffused regions; a capacitor formed on said one side of the silicon layer and having a storage electrode connected to the first diffused region; and a bit line formed on the other side of the silicon layer and connected to the second diffused region, whereby a semiconductor memory device of SOI structure can be easily fabricated.

The bit line connected to the second diffused region is formed on the other side of the semiconductor layer, whereby the bit line can be arranged without restriction by the structure, etc. of the capacitor. Short circuit between the capacitor and the bit line can be prevented.

The above-described object is also achieved by a semiconductor memory device comprising: a silicon layer having a first diffused region and a second diffused region formed therein; a gate electrode formed through an insulating film on one side of the silicon layer between the first and the second diffused regions; a capacitor formed on said one side of the silicon layer and having a storage electrode connected to the first diffused region; a bit line formed on said one side of the silicon layer and connected to the second diffused region; and a strapping word line formed on the other side of the silicon layer and connected to the gate electrode, whereby a semiconductor memory device of SOI structure can be easily fabricated.

In the above-described semiconductor memory device it is preferable that a connection surface of the storage electrode, which are connected to the first diffused region, is substantially parallel with a surface of the storage electrode, which correspond to the connection surface, whereby a DRAM process and an SOI process can be easily unified.

The object of the present invention can be achieved by the semiconductor memory device comprising a semiconductor memory device comprising: a device layer including a semiconductor layer having a first diffused region and a second diffused region formed therein, a transistor having a gate electrode formed through an insulation film on one side of the semiconductor layer between the first and the second diffused regions, and a capacitor formed on said one side of the semiconductor layer and having a storage electrode connected to the first diffused region; a bit line formed on the other side of the semiconductor layer, and extended in a direction normal to the gate electrode; and a support substrate formed on said one side of the semiconductor layer for supporting the device layer; the semiconductor layer including a first region which is extended in the direction of extension of the bit line and includes the first diffused region and the second diffused region, and a second region which is extended in a direction of extension of the gate electrode in the first region and includes the second diffused region; a first contact hole being formed in the first region for connecting the first diffused region to the capacitor; and a second contact hole being formed in the second region for connecting the bit line with the second diffused region, whereby a semiconductor memory device of SOI structure can be easily fabricated.

The bit line connected to the second diffused region is formed on the other side of the semiconductor layer, whereby the bit line can be arranged without restriction by the structure of the capacitor, etc. Short circuit between the capacitor and the bit line can be prevented.

The second contact hole for connecting the bit line with the second diffused region is formed in the second region of the semiconductor layer, whereby the bit line can be connected, spaced from the channel region of the transistor. Even if disalignment takes place in opening the contact hole for the bit line, connection of the bit line with the channel region can be prevented.

In the above-described semiconductor memory device it is preferable that the first region and the second region are connected with each other, whereby connection between the bit line and the channel region can be prevented without adding to the number of fabrication steps.

In the above-described semiconductor memory device it is preferable that the second diffused region in the first region and the second diffused region in the second region are formed spaced from each other.

In the above-described semiconductor memory device it is preferable that the semiconductor memory device further comprises a first wiring layer formed on said one side of the semiconductor layer for connecting the first and the second regions with each other, whereby even in a case that the diffused region resistance between the second diffused region and the bit line increases, connection resistance between the second diffused region and the bit line can be compensated.

In the above-described semiconductor memory device it is preferable that the semiconductor memory device further comprises a strapping word line formed on said other side of the semiconductor layer and connected to the gate electrode, whereby the strapping word line can be easily formed without restriction by the structure of the capacitor, etc.

In the above-described semiconductor memory device it is preferable that the semiconductor memory device further comprises a strapping word line formed on said one side of the semiconductor layer and connected to the gate electrode.

In the above-described semiconductor memory device it is preferable that the semiconductor memory device further comprises a shield electrode formed on the bit line for suppressing interference between the bit lines, whereby noise on the bit line is removed, and interference between the adjacent bit lines can be suppressed.

In the above-described semiconductor memory device it is preferable that the semiconductor memory device further comprises a second wiring layer formed on said the other side of the semiconductor layer and electrically connected to a region of the semiconductor layer between the first and the second diffused regions, whereby charges accumulated in the region of the semiconductor layer between the first and the second diffused regions are released for potential stabilization, and the transistor can have improved reliability.

In the above-described semiconductor memory device it is preferable that the bit line is electrically connected to a region of the semiconductor layer between the first and the second diffused regions, whereby charges accumulated in the region of the semiconductor layer between the first and the second diffused regions are released for potential stabilization.

The object of the present invention can be achieved by a method for fabricating a semiconductor memory device comprising: a gate electrode forming step of forming a gate electrode on one side of a semiconductor substrate; a diffused region forming step of implanting an impurity into the semiconductor substrate with the gate electrode as a mask to form a first diffused region and a second diffused region; a capacitor forming step of forming a capacitor having a storage electrode connected to the first diffused region on the semiconductor substrate with the first and the second diffused regions formed therein; a support substrate forming step of forming a support substrate on the semiconductor substrate with the capacitor formed thereon; and a semiconductor layer forming step of removing the semiconductor substrate at the other side of the semiconductor substrate until bottoms of the second and the first diffused regions are exposed, to form a semiconductor layer, whereby the planarization step of the SOI process and the planarization step of the DRAM process can be rationalized, and fabrication cost reduction is possible.

The capacitor is formed before the substrate is adhered, whereby no high-temperature heat treatment is necessary after the adhesion of the substrate. Accordingly no wafer deformation nor crystal defects are introduced by the high-temperature heat treatment, and fabrication yields can be improved.

In the above-described method for fabricating the semiconductor memory device it is preferable that the method further comprises, after the semiconductor layer forming step, a bit line forming step of forming a bit line connected to the second diffused region, whereby the contact hole for the bit line can be made shallower, and formation of the contact hole can be much simplified.

The bit line can be arranged without restriction by the structure of the capacitor, etc. while short-circuit between the capacitor and the bit line can be prevented. The capacitor and the bit line can be independently located from each other, whereby higher integration can be obtained.

In the above-described method for fabricating the semiconductor memory device, it is preferable that the method further comprises, after the bit line forming step, a shield electrode forming step of forming a shield electrode for suppressing interference between the bit lines.

In the above-described method for fabricating the semiconductor memory device, it is preferable that the method further comprises, after the diffused region forming step and before the bit line forming step, a wiring layer forming step of forming a wiring layer for reducing connection resistance between the bit line and the second diffused region.

In the above-described method for fabricating the semiconductor memory device, it is preferable that the method further comprises, after the diffused region forming step and before the support substrate forming step, a bit line forming step of forming a bit line connected to the second diffused region.

In the above-described method for fabricating the semiconductor memory device, it is preferable that the method further comprises, after the semiconductor layer forming step, a strapping word line forming step of forming a strapping word line connected to the gate electrode.

In the above-described method for fabricating the semiconductor memory device, it is preferable that the method further comprises, after the diffused region forming step, a strapping word line forming step of forming a strapping word line connected to the gate electrode.

In the above-described method for fabricating the semiconductor memory device, it is preferable that after the semiconductor layer forming step, the semiconductor layer except the device region is removed, whereby the semiconductor memory device can be fabricated without forming a device isolation film. Accordingly cell area increase due to birds beaks can be reduced, and the semiconductor memory device can have higher integration.

In the above-described method for fabricating the semiconductor memory device it is preferable that after the semiconductor layer forming step, an impurity of a conduction type different from that of the second and the first diffused regions is doped in a region of the semiconductor layer where no active element is formed, whereby the semiconductor memory device can have higher integration because of device isolation by p-n junction.

In the above-described method for fabricating the semiconductor memory device it is preferable that the method further comprises, before the gate electrode forming step, a device isolation film forming step of forming on said one side of the semiconductor substrate a device isolation film which defines a device region; and in the semiconductor layer forming step the semiconductor substrate is removed at said other side of the semiconductor substrate until a bottom of the device isolation film is exposed, whereby the device isolation film can be used as the stopper, and the semiconductor layer can be easily formed.

In the above-described method for fabricating the semiconductor memory device it is preferable that the method further comprises, before the gate electrode forming step, a device isolation film forming step of forming on said one side of the semiconductor substrate a device isolation film which defines a device region; in the device isolation film forming step, the device region including a first region which is extended in a direction of extension of the bit line and includes the first and the second diffused regions, and a second region which is extended in a direction of extension of the gate electrode in the first region and includes the second diffused region, is formed; in the capacitor forming step the first diffused region is connected with the capacitor in the first region; in the semiconductor forming step the semiconductor substrate is removed at said other side of the semiconductor substrate until a bottom of the device isolation film is exposed; and in the bit line forming step the bit line is connected with the second diffused region in the second region, whereby the bit line can be connected spaced from the channel region, and even if disalignment takes place in forming the opening for the bit line, connection between the bit line and the channel region can be prevented.

In the above-described method for fabricating the semiconductor memory device it is preferable that the method further comprises, the method further comprises, before the gate electrode forming step, a device isolation film forming step of forming on said one side of the semiconductor substrate a device isolation film which defines a device region, and a opening forming step of removing the device isolation film in the first region of the device isolation film to form an opening; the method further comprises, after the semiconductor layer forming step, a strapping word line forming step of forming a strapping word line connected to the gate electrode; in the gate electrode forming step the gate electrode extended in the first region is formed buried in the opening; and in the strapping word line forming step the strapping word line is connected with the gate electrode in the first region, whereby the gate electrodes and the strapping word lines can be easily connected with each other.

The above-described object can be achieved by a method for fabricating a semiconductor memory device comprising a device isolation film forming step of forming a device isolation film on one side of a semiconductor layer, a semiconductor device forming step of forming a semiconductor device on the semiconductor substrate with the device isolation film formed on, and a semiconductor layer forming step of forming a semiconductor layer, in a case that the device isolation film includes a first device isolation film having a first film thickness and a second device isolation film having a second film thickness which is smaller than the first film thickness, the semiconductor layer forming step comprising the steps of polishing the semiconductor substrate until the first device isolation film is exposed, etching the exposed first device isolation film so that the first device isolation film and the second device isolation film have substantially the same film thickness, and polishing the semiconductor substrate until the second device isolation film is exposed.

DETAILED DESCRIPTION OF THE INVENTION

[A first Embodiment]

The semiconductor memory device and a method for fabricating the same according to a first embodiment of the present invention will be explained with reference to FIGS. 1 to 5.

Figure 1:
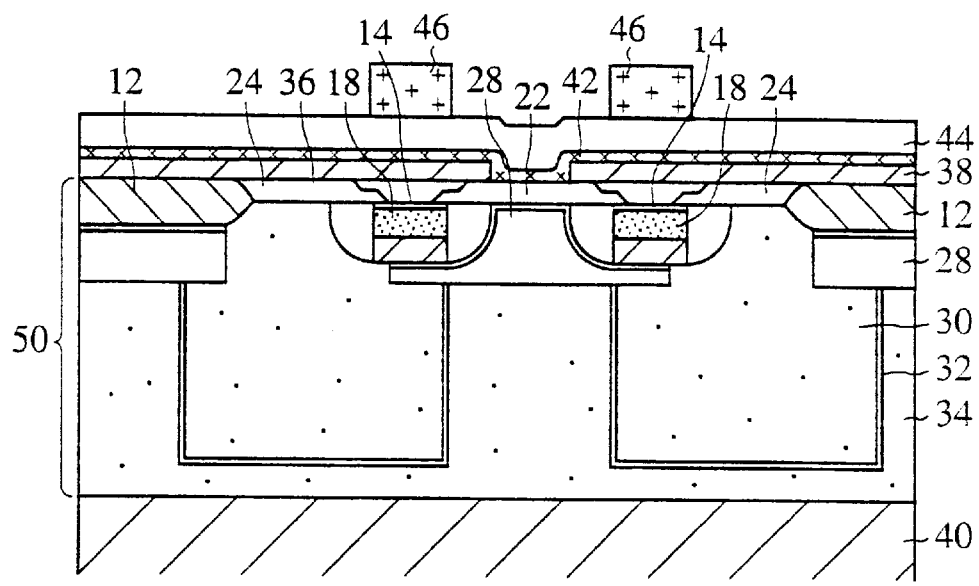
FIG. 1 is a diagrammatic sectional view of the semiconductor memory device according to a first embodiment of the present invention, which shows a structure thereof.

FIG. 1 is a diagrammatic sectional view of the semiconductor memory device according to the present embodiment, which explains a structure thereof. FIGS. 2 to 5 are sectional views of the semiconductor memory device on the steps of the method for fabricating the semiconductor memory device according to the present embodiment.

First, a structure of the semiconductor memory device according to the present embodiment will be explained with reference to FIG. 1.

A device layer 50 with memory cells formed on is adhered to a support substrate 40.

A source diffused region 22 and a drain diffused region 24 are formed independent of each other in a semiconductor layer 36 formed in the device layer 50 and defined by a device isolation film 12. A gate electrode 18 to be a word line is formed through a gate oxide film 14 below the conductor film 36 between the source diffused region 22 and the drain diffused region 24. Thus a memory cell transistor including the gate electrode 18, the source diffused region 22 and the drain diffused region 24 is formed with the gate electrode 18 positioned on the side of the support substrate 40.

The drain diffused region 24 of the memory cell transistor is connected to a storage node (capacitor electrode or storage electrode) 30 formed of polycrystal silicon. A cell plate 34 is formed below the storage node 30 through a capacitor dielectric film 32. Thus a capacitor including the storage node 30, the capacitor dielectric 32 and the cell plate 34 is formed.

A bit line 42 connected to the source diffused region 22 is formed on the device layer 50 adhered to the support substrate 40 through an insulating film 38.

A strapping word line 46 for decreasing electric resistance of the word line is formed on the bit lines 42 through an insulating film 44. The strapping word lines 46 are connected to the gate electrodes 18 at a certain pitch in a region between the cell arrays and function to supplement the gate electrodes 18, whose resistance is difficult to decrease. That is, voltage decrease of the gate electrodes 18 due to resistance increase of the gate electrodes 18 due to micronization, etc. is prevented.

A cell array is a collection of the memory cells, and a plurality of the cell arrays are arranged to form a memory of a large capacity.

In the source/drain diffused regions current flows in opposite directions for writing and reading. It is difficult to define which is called the source diffused region or the drain diffused region. In this specification it is defined for the convenience of explanation that the diffused region connected to the bit lines 42 is the source diffused region 22, and the diffused region connected to the storage node 30 is the drain diffused region 24.

Thus, a RAM comprising one-transistor and one-capacitor memory cells is arranged on the support substrate 40. FIG. 1 is a sectional view of the semiconductor memory device comprising two memory cells formed adjacent to each other.

Then, the method for fabricating the semiconductor memory device will be explained.

Figure 2A:
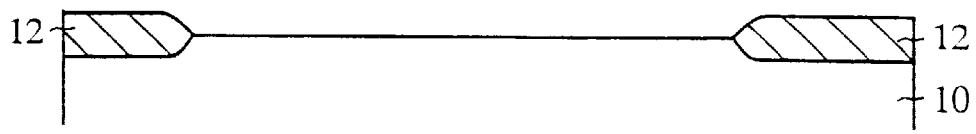
FIGS. 2A to 2D are sectional views of the semiconductor memory device according to the first embodiment on the steps of the method for fabricating the same, which explain the method (Part 1).

First, the device isolation film 12 is formed on the primary surface of a silicon substrate 10 in an about 200 nm-thickness by, e.g., the usual LOCOS method (FIG. 2A).

Figure 2B:
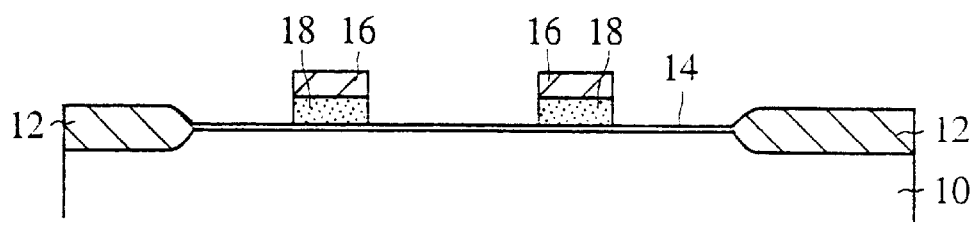

Then the gate oxide film 14 is formed in an about 5 nm-thickness by heat oxidation. Subsequently a polycrystal silicon film containing a high concentration of, e.g., phosphorus (P) and a silicon oxide film are continuously formed respectively in an about 150 nm-thickness and an about 100 nm-thickness by CVD (Chemical Vapor Deposition), and then the polycrystal silicon film and the silicon oxide film are concurrently patterned by the usual lithography and etching. Thus the gate electrodes 18 having upper surfaces covered with the silicon oxide film 16 are formed (FIG. 2B).

The silicon oxide film 16 may be replaced by another insulating film, such as silicon nitride film or others. The silicon oxide film 16 may not be formed in a case that the DRAM can be formed without the use of self-alignment, i.e., when a sufficient margin can be secured so that when disalignment takes place, the other wiring layer is not formed on the gate electrodes 18.

Then, with the silicon oxide film 16 and the gate electrodes 18 as a mask, doping ions are implanted to form by self-alignment a lightly doped diffused region which is to be an n⁻layer of LDD (Lightly Doped Drain) structure. Next, a silicon oxide film of, e.g., an about 150 nm-thickness is formed and then is anisotropically etched to form patterned sidewall oxide films 20 of the silicon oxide film on the sidewalls of the silicon oxide film 16 and the gate electrodes 18.

Then, heavily doped ions as required are implanted to form the source diffused region 22 and the drain diffused region 24. Thus memory cell transistors comprising the gate electrodes 18, the source diffused region 22 and the drain diffused region 24 are formed.

In the semiconductor memory device shown in FIG. 2 the memory cell transistors unessentially have the LDD structure. The memory cell transistors may comprise the source diffused region 22 and the drain diffused region 24 of, e.g., an n⁻layer alone.

Figure 2C:
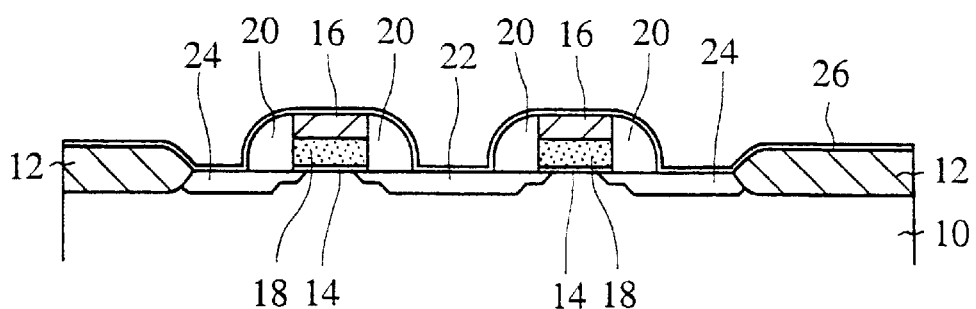

Subsequently an etching stopper film, e.g., a silicon nitride film 26 is deposited on the silicon substrate 10 with the memory cell transistors formed on (FIG. 2C).

Figure 2D:
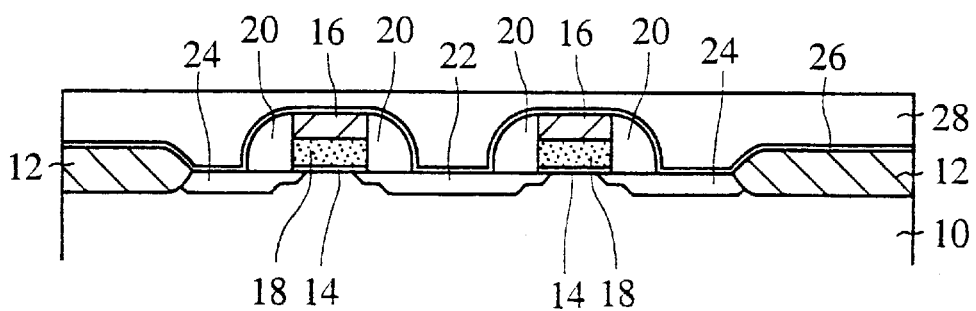

Then, a silicon oxide film, for example, is formed by CVD to form the insulation film 28. Next, the surface of the insulation film 28 is polished by CMP (Chemical Mechanical Polishing) to planarize the surface of the insulation film (FIG. 2D). For the planarization, a planarization technique, such as reflow or others, may be used, but in consideration of global flatness, etc., CMP is preferable for the planarization.

Figure 3A:
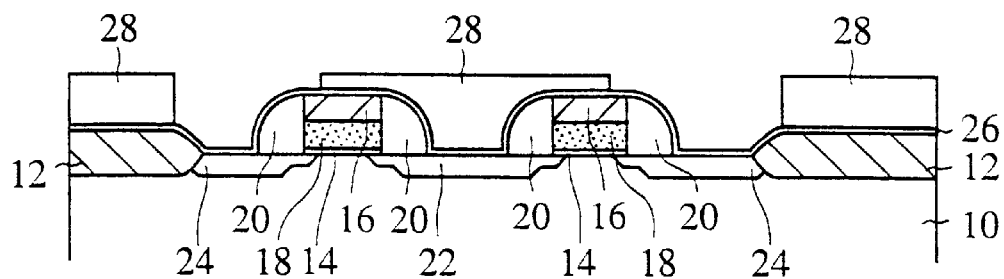
FIGS. 3A to 3C are sectional views of the semiconductor memory device according to the first embodiment on the steps of the method for fabricating the same, which explain the method (Part 2).

Next, openings are formed in the insulation film 28 on the drain diffused region 24 of the memory cell transistors (FIG. 3A). The etching of the openings is conduced under a condition that the silicon nitride film 26 functions as the etching stopper, whereby even when the etching amount differs depending on locations of the openings, the openings can be formed by self-alignment without etch residue.

Figure 3B:
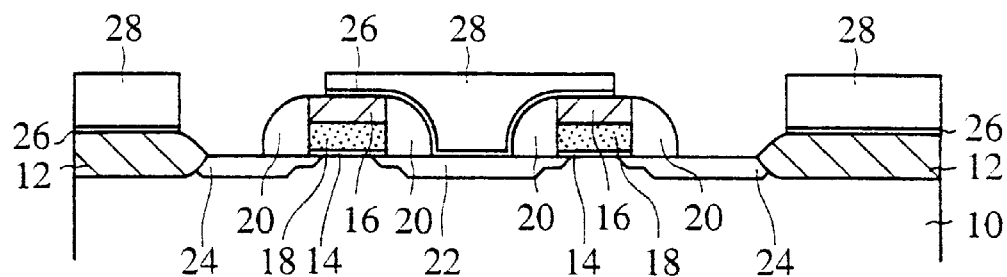

Subsequently residual silicon nitride film 26 on the bottoms of the openings is etched off with a boiled phosphoric acid solution so that the openings reach the top of the drain diffused region 24 (FIG. 3B). For the removal of the silicon nitride film 26, RIE (Reactive Ion Etching) may be used.

Then, a polycrystal silicon film, for example, is deposited by CVD and patterned to form the storage nodes 30 connected to the drain diffused region 24.

Next, an insulating film to be the capacitor dielectric film 32 is formed on the surfaces of the storage nodes 30. Then, a polycrystal silicon film, for example, is deposited by CVD to form the cell plate 34. Thus the capacitors are formed.

In the present embodiment, before the substrate is adhered, the capacitors are thus formed, and the high temperature heat treatments required for the formation of the capacitors are not conducted after the adhesion of the substrate. Accordingly the wafer is free from deformation and introduction of crystal defects. Higher yields can be obtained in comparison with the case where an SOI substrate is used from the start of the process.

The capacitors in which the connection surfaces of the storage nodes 30 and the drain diffused region 24, and the surfaces of the storage nodes 30 are substantially parallel with each other are formed, whereby the following planarization can be simplified, and the DRAM process and the SOI process can be easily unified.

Figure 3C:
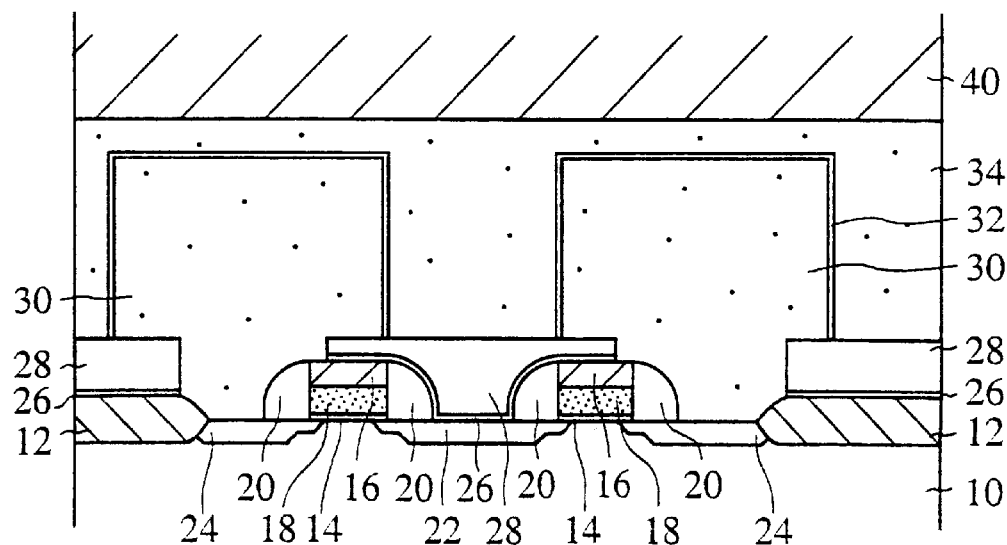

Then the surface of the cell plate 34 is planarized by CPM, and the support substrate 40 is adhered to the planarized surface (FIG. 3C).

In the present embodiment, the support substrate 40 is adhered to the cell plate 34 planarized by polishing but is not adhered essentially to the cell plate 34. For example, it is possible that an insulating film is deposited on the cell plate 34, and the support substrate 40 is adhered to the upper surface of the insulating film. To complete the adhesion at 850° C. for about 10 minutes it is also effective to form a 50 nm–1 μm thickness insulating film meltably having a low melting point, such as BPSG (Boron-Phosphorus-Silicate Glass) or others.

In the present embodiment the adhered substrate is exposed only to the light heat process in post process, and the support substrate 40 is not essentially formed of a material having a high melting point. Inexpensive substrates may be used as long as they have a heat resistance of only about 500° C., which reduces fabrication costs.

Then, the silicon substrate 10 is polished off the backside of the silicon substrate 10 by CMP. At this time, the device isolation film 12 is used as the stopper, and the polishing is stopped when the device isolation film 12 is exposed. It is preferable that a thickness of the device isolation film 12 is so set that the source diffused region 22 and the drain diffused region 24 are exposed when the polishing is over.

The silicon substrate 10 is thus polished, whereby the semiconductor layer 36 with the source diffused region 22 and the drain diffused region 24 formed in is perfectly isolated in regions defined by the device isolation film 12.

Only contacts are formed on the thus polished surface, and it is not necessary to form devices, such as transistors or others. It is not necessary that the polishing forms a speculum of high precision.

The usual bonded SOI technique requires the step of planarizing the surface of a semiconductor substrate and adhering another substrate to the planarized surface, and the step of polishing the semiconductor substrate at the backside thereof. The highly integrated DRAM fabricating process requires the step of forming storage nodes on the surface of a semiconductor substrate and then planarizing the surface, and the step of forming wiring and then planarizing the surface.

The present embodiment, however, can rationalize the planarization step of the bonded SOI technique, and the planarization step of the DRAM fabrication process, whereby fabrication costs can be much decreased.

That is, to form an bonded SOI, the planarization step of planarizing the surface before the adhesion, and the step of polishing the silicon substrate adhered to a support substrate to form a semiconductor layer, i.e., two polishing steps are needed. The surface of the chip with the semiconductor layer formed on is plane, and when a wiring layer is formed after the formation of the semiconductor layer, a planarization step is not conducted or simplified. Accordingly an SOI structure can be formed at low costs without planarization steps.

Subsequently, after the insulating film 38 with the openings formed in is formed on the source diffused region 22, the bit lines 42 are formed.

In the present embodiment, the bit lines 42 are formed after the capacitors are formed, and no high-temperature heat treatment is necessary after the formation of the bit lines 42. The bit lines 42 are formed of a low-resistance metal material, such as aluminium, Ti (titanium), TiN (titanium nitride), W (tungsten) or others, and can have a thickness of below about 1/10 the thickness of the bit lines formed of a high-melting point material, such as polycrystal silicon, tungsten silicide or others. By making the thickness of the bit lines small, a step on the bit lines 42 can be made extremely small. Accordingly, in forming, e.g., the strapping word lines 46 above the bit lines 42, no planarization is necessary, or the planarization step can be simplified.

Figure 4A:
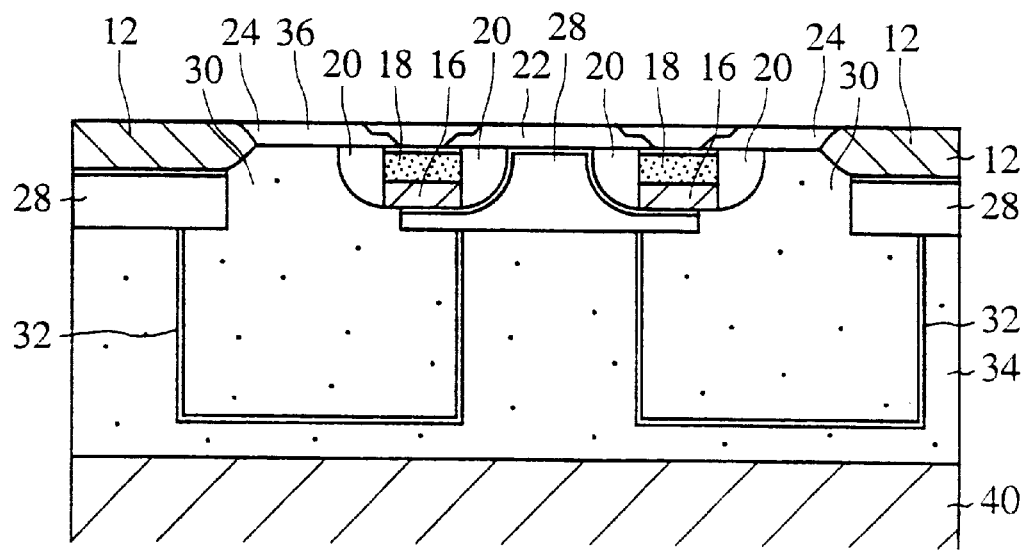
FIGS. 4A and 4B are sectional views of the semiconductor memory device according to the first embodiment on the steps of the method for fabricating the same, which explain the method (Part 3).
Figure 4B:
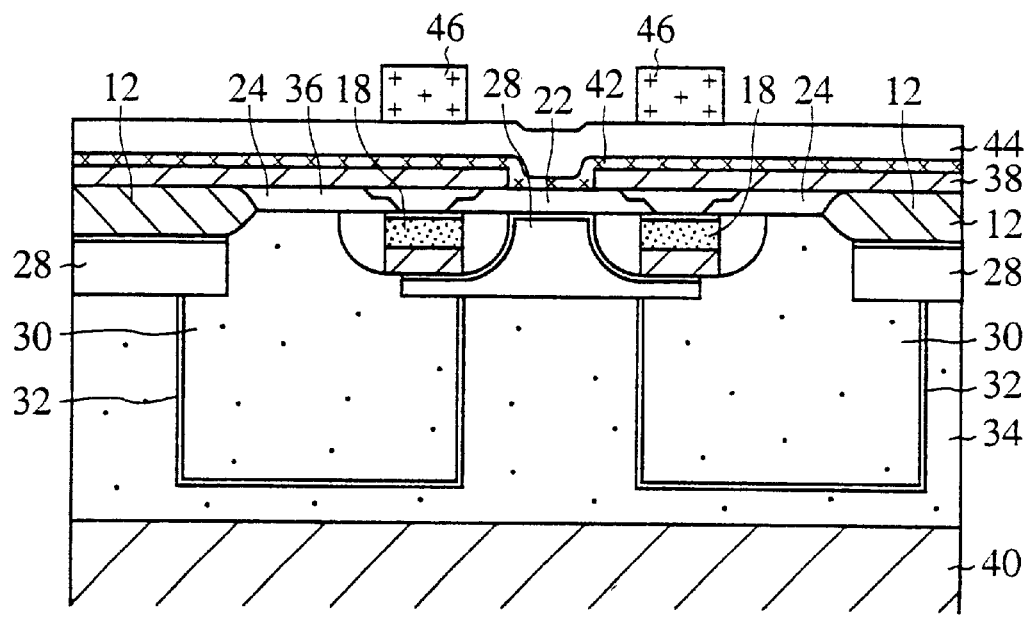

Then, the strapping word lines 46 are formed on the bit lines 42 through the insulating film 44 (FIG. 4B).

Figure 5A:
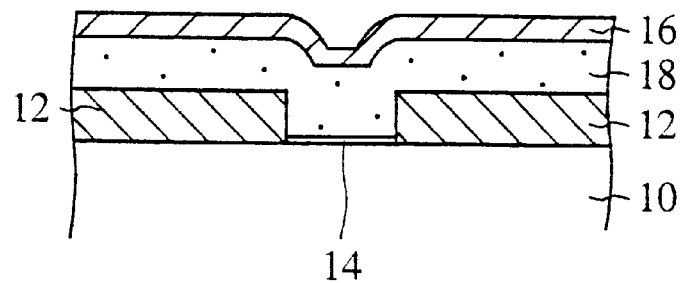
FIGS. 5A to 5C are sectional views of the semiconductor memory device according to the first embodiment on the steps of the method for fabricating the same, which explain the method (Part 4).
Figure 5B:
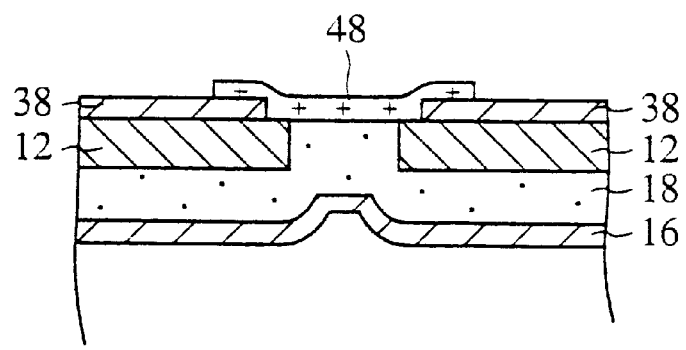
Figure 5C:
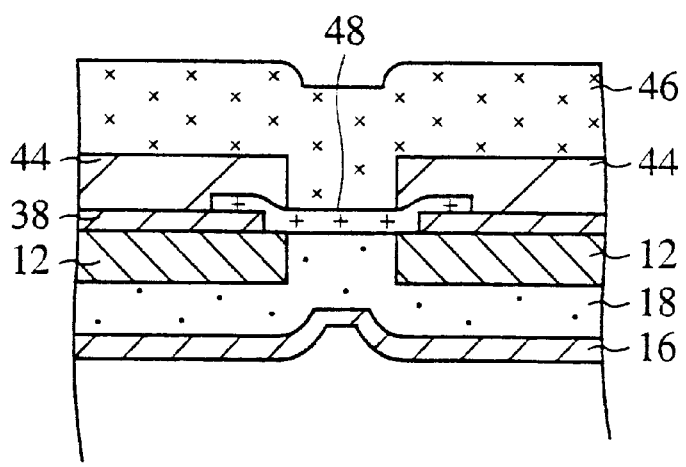

The strapping word lines 46 can be formed by the fabrication steps exemplified in FIG. 5. FIG. 5 shows sectional views of the device along the word lines.

In the step of FIG. 2B, before the gate oxide film 14 is formed, the device isolation film 12 in regions where the word line contacts are to be formed is etched off. Thus the formed gate electrodes 18 are buried in the strapping word line contacts (FIG. 5A).

Then, in the step of FIG. 4B, when the bit lines 42 are formed, a wiring material 48 is formed on the gate electrodes 18 of the strapping word line contacts (FIG. 5B).

Subsequently when the strapping word lines 46 are formed, contact holes for exposing the wiring material 48 are formed in the insulating film 44, and the gate electrodes 18 and the strapping word lines 46 are connected to each other through the contact holes.

Thus the strapping word lines 46 are formed.

According to the present embodiment, the planarization step in the bonded SOI technique and the planarization step in the DRAM process can be rationalized, whereby fabrication costs can be much decreased.

The capacitors are formed on the side of the support substrate, and the bit lines are formed through the semiconductor layer on the opposite side, which makes that the bit line contact holes can be very shallow. The formation of the contacts can be much simplified. The bit lines can be arranged without restriction by structures of the capacitors, etc. while electric short-circuit between the capacitors and the bit lines can be prevented.

An alignment rule for the capacitors-the bit lines can be less strict, which allows higher integrations.

The capacitors are formed on the side of the support substrate, and the strapping word lines are formed through the semiconductor layer on the opposite side, whereby the contact holes interconnecting the word lines and the strapping word lines can be very shallow, and the formation of the contacts can be very simple.

As the DRAM generation develops, the storage nodes become higher with a result that the contact holes tend to be deeper. This tendency needs etching techniques by which contact holes of high aspect ratios can be formed, and means for preventing increase of contact resistances. Accordingly the semiconductor memory device according to the present embodiment and a method for fabricating the same is effective in making the contacts shallow, and other respects.

Figure 6:
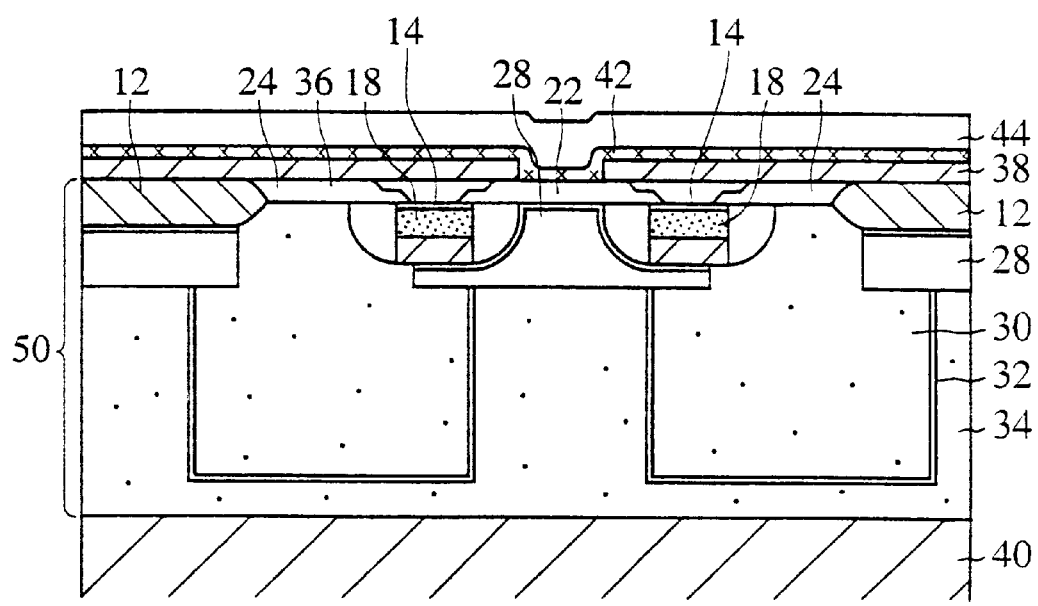
FIG. 6 is a diagrammatic sectional view of a variation of the semiconductor memory device according to the first embodiment, which explains a structure thereof (Part 1).

The semiconductor memory device according to the present embodiment includes the strapping word lines, but as shown in FIG. 6, the strapping word lines 46 may not be formed.

In the present embodiment, the strapping word lines 46 are formed above the bit lines 42, but the bit lines 42 may be formed above the strapping word lines 46.

In the present embodiment, the support substrate 40 is adhered to support the device layer 50, but the adhered substrate is not essential as long as the device layer 50 can be supported. For example, another molten material is poured to the surface which supports the device layer 50 and solidified to thereby form the support member. In this case, it is also possible to omit the planarization step of planarizing the surface of the cell plate 34.

In the present embodiment, the device isolation layer 12 is used as the stopper in forming the semiconductor layer 36 and is polished until the source diffused region 32 and the drain diffused region 24 are exposed on the surface. It is not essential, however, that the source diffused regions 22 and the drain diffused region 24 are exposed. In the case that the source diffused region 22 and the drain diffused region 24 are not exposed on the surface of the semiconductor layer 36, in FIG. 4B, bit line contact holes are formed i the insulating film 38, an impurity is introduced into the contact hole by, e.g., ion implantation to form a doped layer connected to the drain diffused region 24. As a result, contact of the bit lines is compensated, and the drain diffused region 24 and the bit lines 42 can be electrically connected with each other.

To remove noise on the bit lines or prevent interference between the adjacent bit lines, the so-called shield bit line structure in which a shield electrode is provided to cover the bit lines is effective. In the present embodiment, as exemplified in FIG. 7, a shield electrode can be provided.

That is, after the bit lines 42 are formed, the shield electrode 54 is formed through an insulating film 52. Then an insulating film 44 is deposited on the shield electrode 54, and the strapping word lines 46 are formed as required.

By thus forming the shield bit line structure, in the semiconductor memory device according to the present embodiment it is possible to prevent interference between the bit lines can be suppressed.

In the case that the shield electrode 54 is provided in the semiconductor memory device according to the present embodiment, the shield electrode 54 is present only in the cell arrays and is absent between the cell arrays. The shield electrode 54 is not a barrier to forming the contacts between the strapping word lines 46 and the gate electrodes 18 in the regions between the cell arrays.

On the surface of the semiconductor layer 36 on which the shield electrode 54 is formed the capacitors and other wiring layer are not formed, and it is not necessary to form the contact holes through the shield electrode 54. Accordingly electrical connection of the shield electrode 54 with the other wiring layer can be prevented, and design rules can be less strict.

In a transistor formed on an SOI layer, a region (hereinafter called a body) corresponding to the substrate of the usual MOS transistor formed on a bulk substrate, i.e., the semiconductor layer 36 directly below the gates is generally electrically floating. As a result, the body is apt to be unstable in potential, and often memory operations become unstable. Although being less influential at low source voltages, at a relatively high source voltage of above 3 V, a disadvantage that the source-drain voltage resistance is degraded is often caused.

To prevent such influence, the body must be electrically connected to another region, but to lead electrodes from the body it is necessary to provide an independent space for openings for the electrodes, etc. This adds to a cell area and makes difficult improvement to integration.

The semiconductor memory device according to the present embodiment, however, has the SOI structure having the transistors with the semiconductor layer formed above the gate electrodes, which allows the body contacts to be very easily formed.

Figure 8:
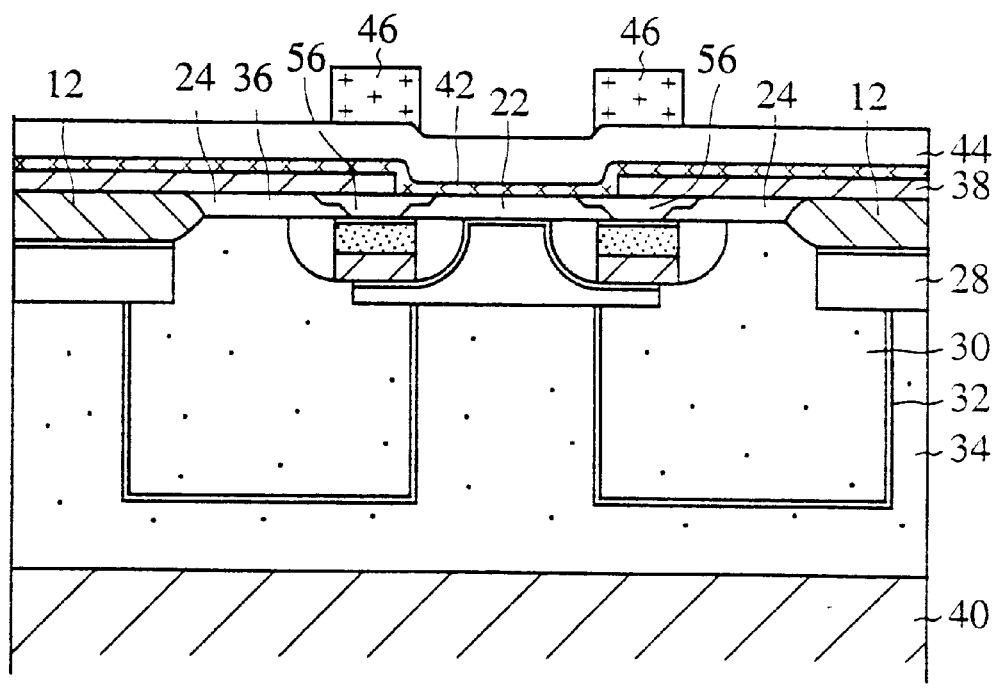
FIG. 8 is a diagrammatic sectional view of a variation of the semiconductor memory device according to the first embodiment, which explains a structure thereof (Part 3).

For example, the semiconductor memory device shown in FIG. 8, the bit line contact holes opened in the insulating film 38 have a large diameter so as to allow the bit lines to be connected to the source diffused region 22 and the body 56.

By thus connecting the bit lines 42 to the body 56, a trace of charge accumulated in the body 56 can be released through the bit lines 42. The body 56 can have a stable potential.

The body 56 is generally lightly doped, and when the bit lines 42 are connected to the body 54, ohmic contact is not easily formed at the contacts. The absence of the ohmic contact causes no problem for the purpose of releasing a trace of charge accumulated in the body 56 through the bit lines.

[A Second Embodiment]

The semiconductor memory device according to a second embodiment of the present invention and a method for fabricating the same will be explained with reference to FIGS. 9 to 14. The same members of the present embodiment as those of the semiconductor memory device according to the first embodiment are represented by the same reference numerals so as not to repeat or to simplify their explanation.

Figure 9:
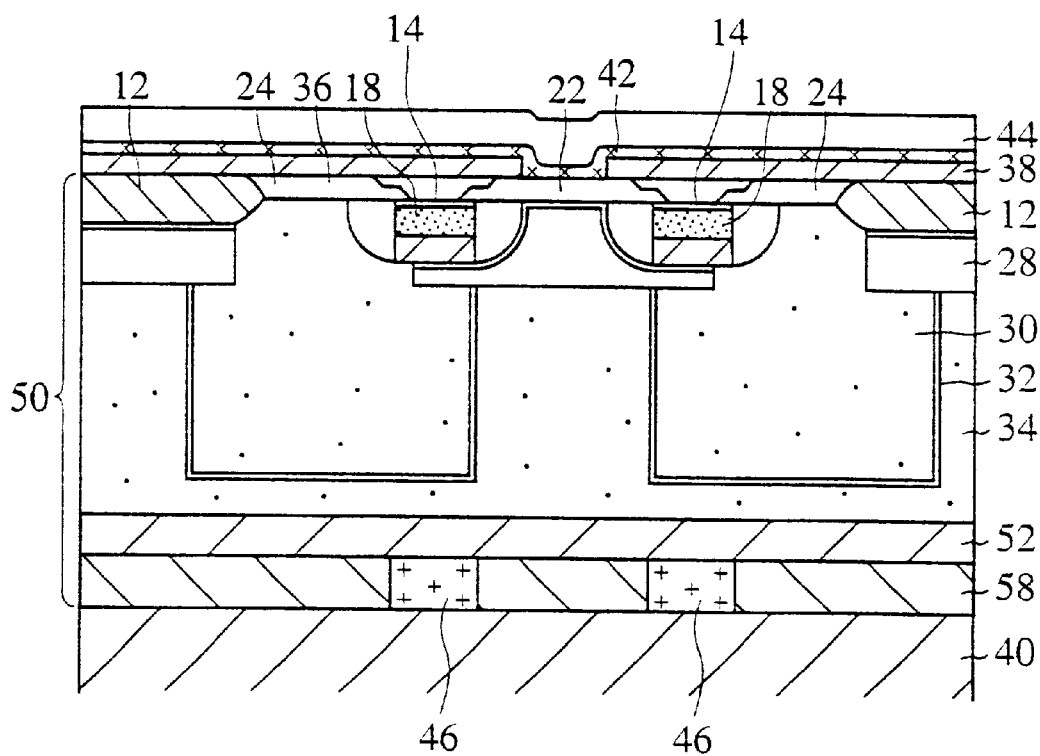
FIG. 9 is a diagrammatic sectional view of the semiconductor memory device according to a second embodiment of the present invention.

FIG. 9 is a diagrammatic sectional view of the semiconductor memory device according to the present embodiment, which show a structure thereof. FIGS. 10 to 23 are sectional views of the semiconductor memory device according to the present embodiment on the steps of the method for fabricating the same, which explain the method.

The semiconductor memory device according to the present embodiment is characterized in that strapping word lines 46 are formed on the side of a support substrate 40. That is, the strapping word lines 46 which decrease electric resistance of word lines 18 are formed below a cell plate 34 through an insulating film 52. The strapping word lines 46 are connected to the gate electrodes, spaced from each other at a certain pitch.

Thus a DRAM comprising one-transistor and onecapacitor memory cells is arranged on the support substrate 40.

Then, the method for fabricating the semiconductor memory device according to the present embodiment will be explained with reference to FIGS. 10 to 14.

In the same way as the method for fabricating the semiconductor memory device according to the first embodiment shown in FIGS. 2A–2D, memory cell transistors and an insulating film having the surface planarized are formed.

Figure 10A:
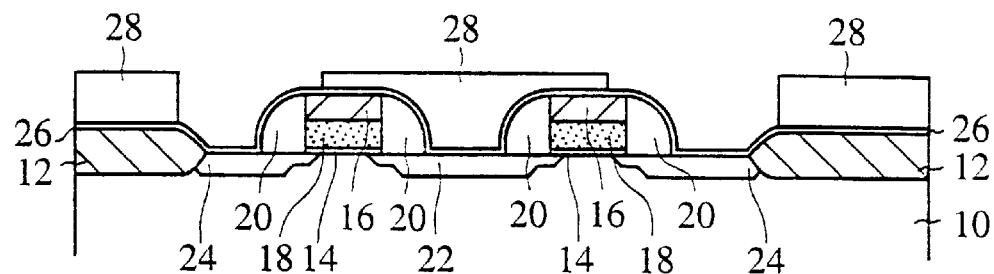
FIGS. 10A to 10C are sectional views of the semiconductor memory device on the steps of the method for fabricating the same, which explain the method (Part 1).

Then, openings are formed in the insulating film 28 on the drain diffused region 24 of the memory cell transistors (FIG. 10A).

Figure 10B:
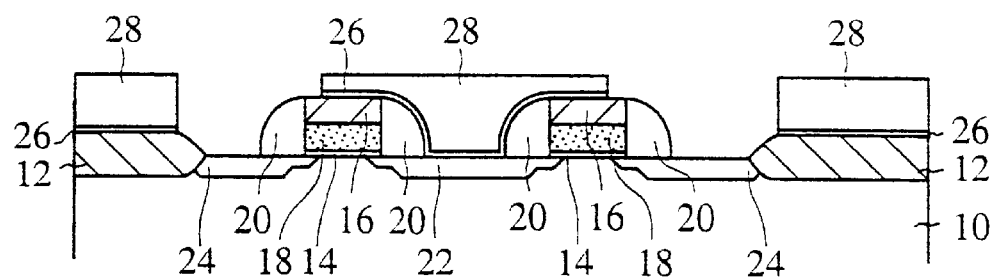

Subsequently, the silicon nitride film 26 remaining on the bottoms of the openings is etched off by, e.g., a boiled phosphoric acid solution, and the openings reach the upper surface of the drain diffused region 24 (FIG. 10B).

Next, a polycrystal silicon film, for example, is deposited by CVD and patterned to form storage nodes 30 connected to the drain diffused region 24.

Then, an insulating film to be a capacitor dielectric film 32 is formed on the surfaces of the storage nodes 30.

Subsequently, a polycrystal silicon film, for example, is deposited by CVD to form a cell plate 34. Thus capacitors are formed.

Figure 10C:
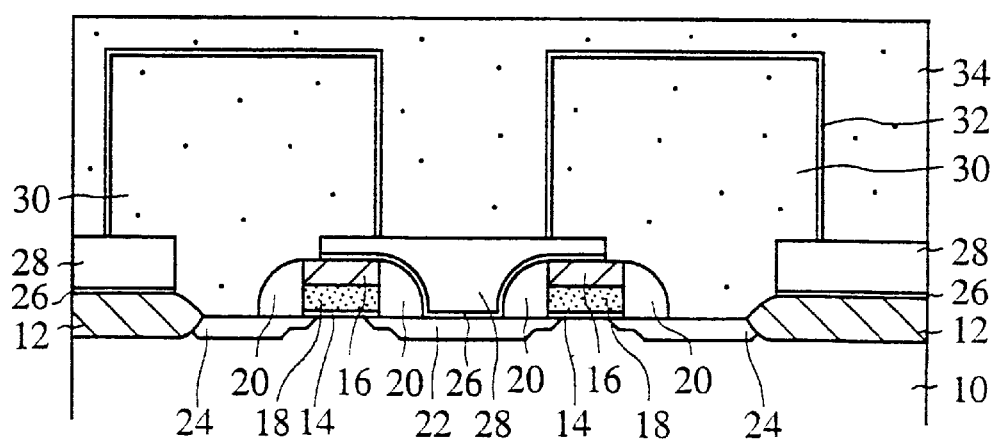

Then, the surface of the cell plate is planarized by CMP to form the capacitors comprising the storage nodes 30, the capacitor dielectric film 32 and the cell plate 34 (FIG. 10C).

Then, a silicon oxide film, for example, is deposited by CVD to form an insulating film 52.

Figure 11A:
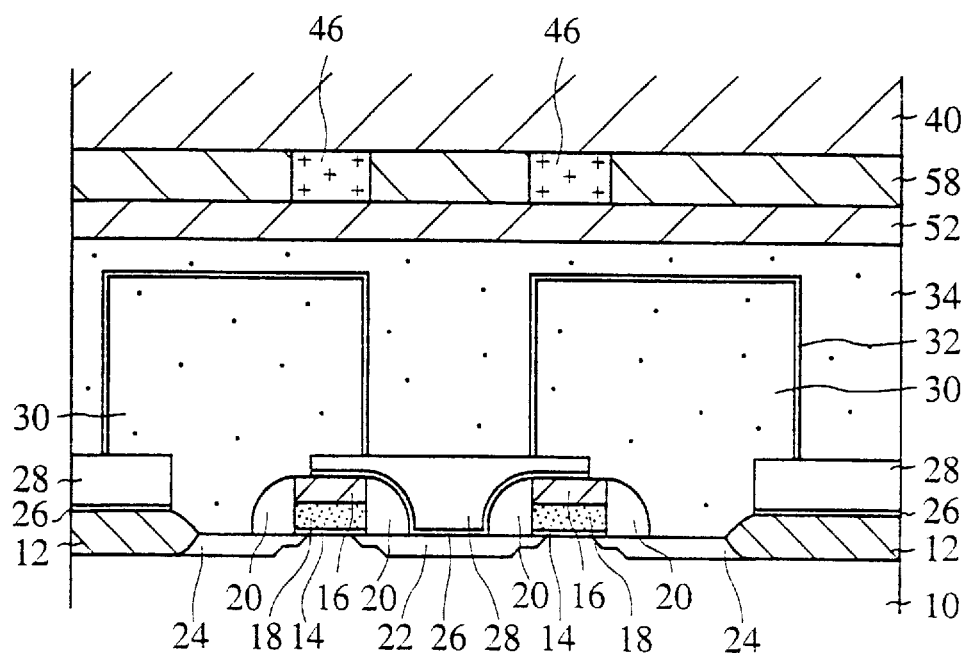
FIGS. 11A and 11B are sectional views of the semiconductor memory device on the steps of the method for fabricating the same, which explain the method (Part 2).

Next, the strapping word lines 46 are formed through an insulating film 44. Then, a polycrystal silicon oxide film, for example, is deposited on the strapping word lines 46 to form an insulating film 58, and next the surface is planarized and adhered to the support substrate 40 (FIG. 11A).

Subsequently the silicon substrate 10 is polished off the backside of the silicon substrate 10 by CMP to form an insulating film 38 having openings which reach the surface of the source diffused region 22. Then bit lines 42 are formed.

Figure 11B:
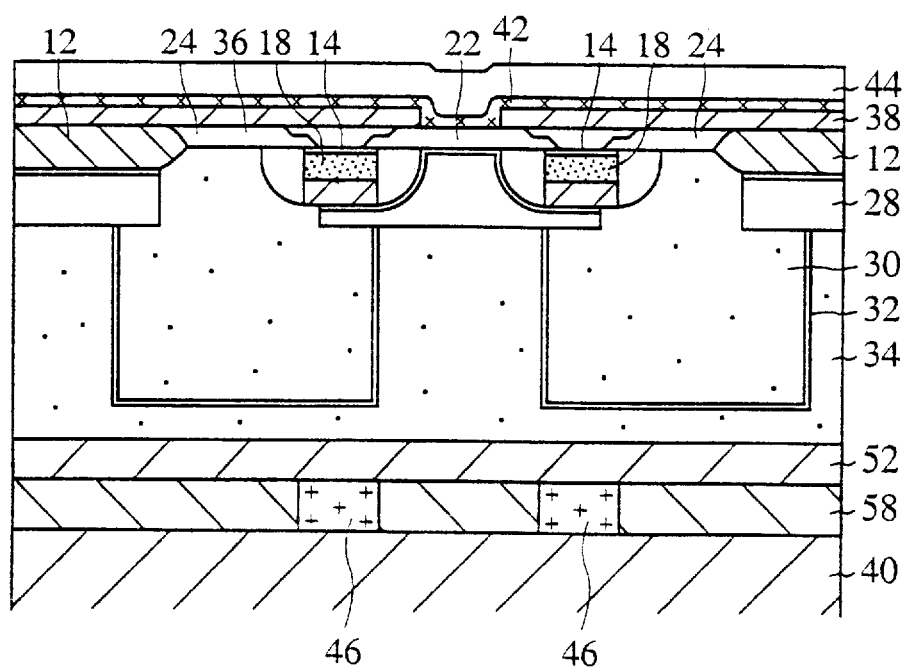

Then, an insulating film 44 is deposited on the bit lines 42, and the DRAM comprising one-transistor and one-capacitor memory cells is formed (FIG. 11B).

In the method for fabricating the semiconductor memory device according to the second embodiment, it is necessary to connect the gate electrodes 18 and the strapping word lines 46 with each other, and they can be connected with each other by the steps exemplified in FIG. 13.

Figure 12A:
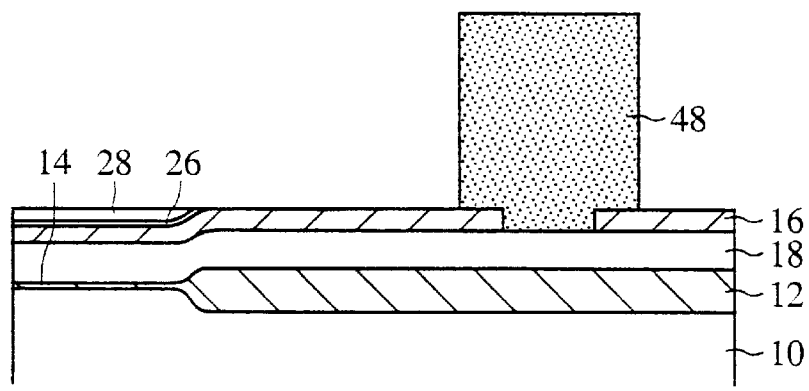
FIGS. 12A to 12C are sectional views of the semiconductor memory device on the steps of the method for fabricating the same, which explain the method (Part 3).
Figure 12B:
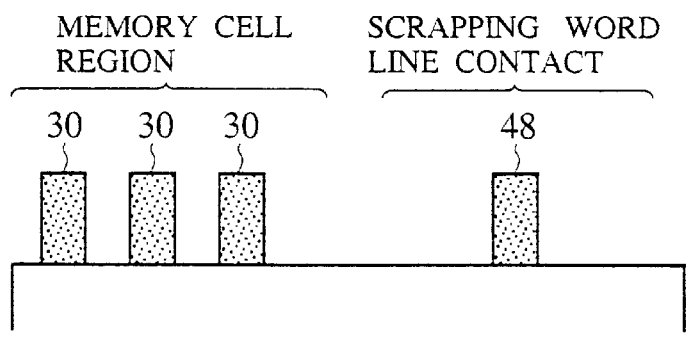

In the step of FIG. 12A, before the polycrystal silicon film to be the storage nodes 30 is deposited, the silicon oxide film 16 in regions where strapping word line contacts are to be formed is removed.

Then, the polycrystal silicon film is processed to be the storage nodes 30 while the polycrystal silicon film is left in the regions for the word line contacts to be formed in. Thus a wiring material 48 connected to the gate electrodes 18 is formed (FIG. 12A). The sectional view of FIG. 12B has a contraction scale different from that of FIG. 12A to make clear the relationship between the memory cell regions and the strapping word line contacts. The sectional views following FIG. 12B have the same contraction scale as FIG. 12B.

Figure 12C:
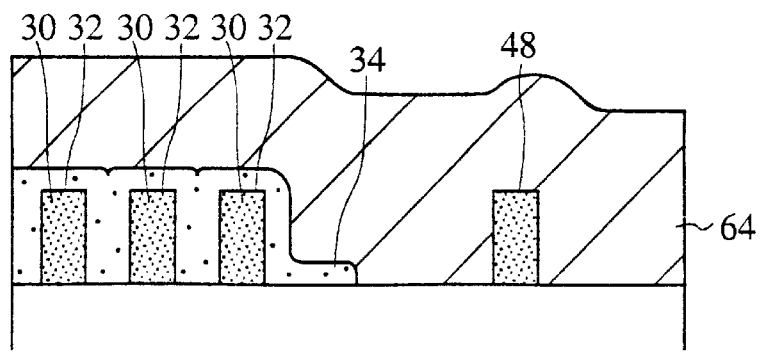

Next, an insulating film to be a capacitor dielectric film 32, and a polycrystal silicon film to be the cell plate 34 are deposited. Subsequently the cell plate 34 except that in the memory cell regions is removed, and then a silicon oxide film, for example, is deposited by CVD to form an insulating film 64 (FIG. 12C).

Figure 13A:
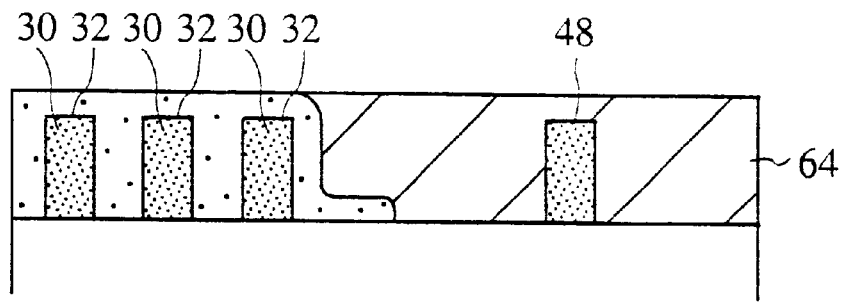
FIGS. 13A to 13C are sectional views of the semiconductor memory device on the steps of the method for fabricating the same, which explain the method (Part 4).

Then, in FIG. 10C the cell plate 34 is planarized by CMP while the insulating film 64 is planarized, to planarize the surface of the substrate on the same level (FIG. 13A).

Figure 13B:
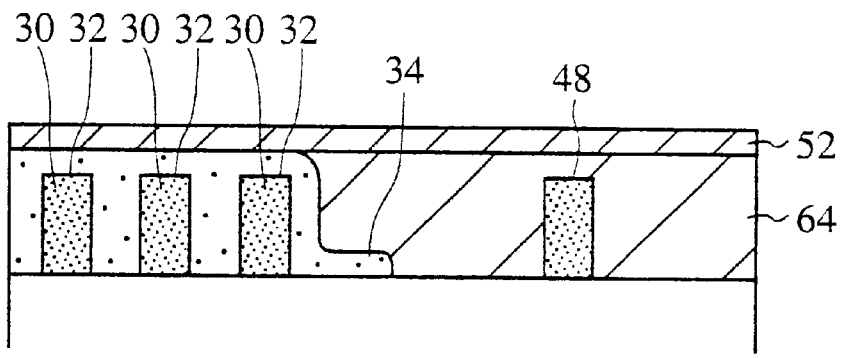

Next, a silicon oxide film, for example, is deposited by CVD to form an insulating film 52 (FIG. 13B).

Figure 13C:
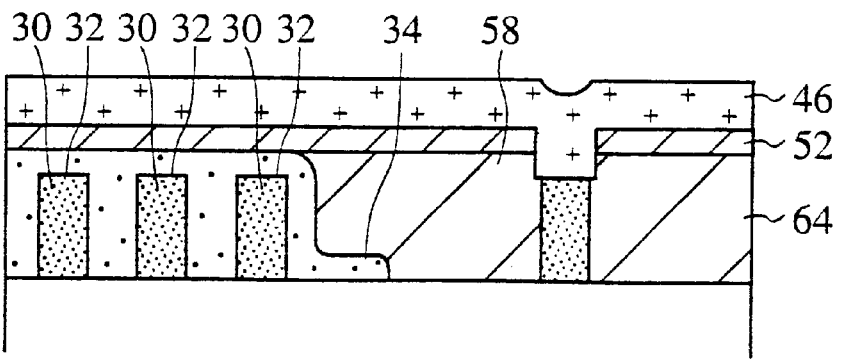

Subsequently openings are formed in the insulating films 64, 52 on the wiring material 48 and then the strapping word lines 46 are formed. Thus the gate electrodes 18 (word lines) and the strapping word lines are connected with each other (FIG. 13C).

Then, a silicon oxide film, for example, is deposited on the strapping word lines 46, and the surface is planarized and adhered to the support substrate 40. And the structure of FIG. 11A is formed.

Thus the strapping word lines 46 can be formed.

As described above, according to the present embodiment, the planarization step in the bonded SOI technique and the planarization step in the DRAM fabrication process can be rationalized, whereby fabrication costs can be much reduced.

The wiring material 48 for connecting the strapping word lines 46 is formed concurrently with formation of the storage nodes 30, whereby the contact holes formed in the insulating film 64 can be made shallow. This facilitates formation of the contacts of the strapping word lines 46 in a case that the strapping word lines 46 are formed on the side of the support substrate 40.

Figure 7:
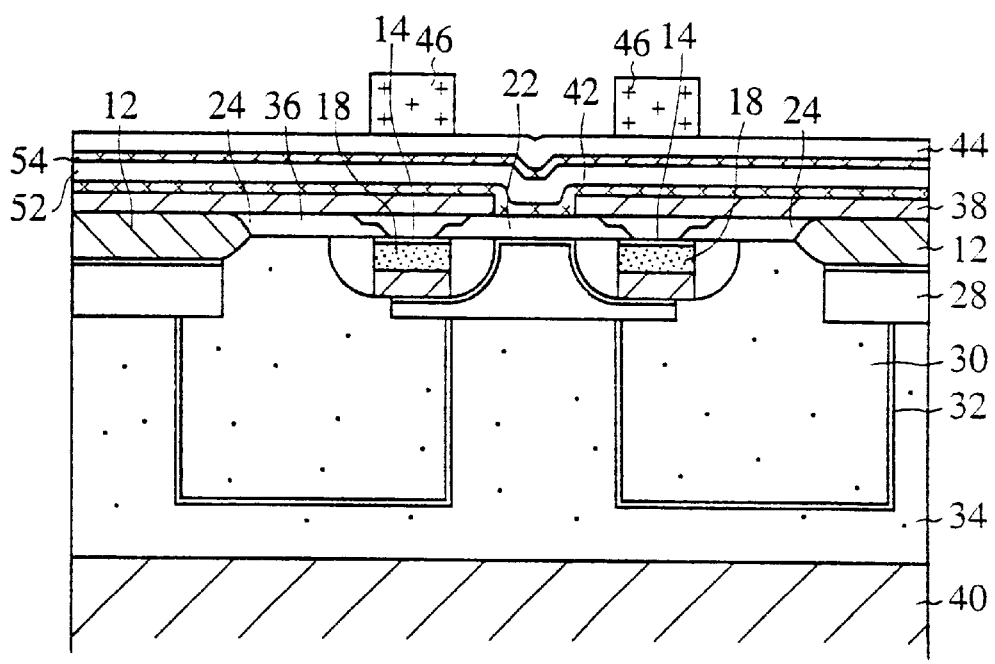
FIG. 7 is a diagrammatic sectional view of a variation of the semiconductor memory device according to the first embodiment, which explains a structure thereof (Part 2).

In a case that it is preferred to remove noise on the bit lines, and interference between the adjacent bit lines is prevented, a shield electrode may be formed in the same way as in the semiconductor memory device according to one variation of the first embodiment, which is shown in FIG. 7.

In a case that it is preferred to form body contacts, the body contacts may be formed in the same way as in the semiconductor memory device according to one variation of the first embodiment, which is shown in FIG. 8.

[A Third Embodiment]

The semiconductor memory device according to a third embodiment of the present invention will be explained with reference to FIGS. 14 to 18. The same members of the present embodiment as those of the semiconductor memory device according to the first and the second embodiments and the method for fabricating the same are represented by the same reference numerals so an not to repeat or to simplify their explanation.

Figure 14:
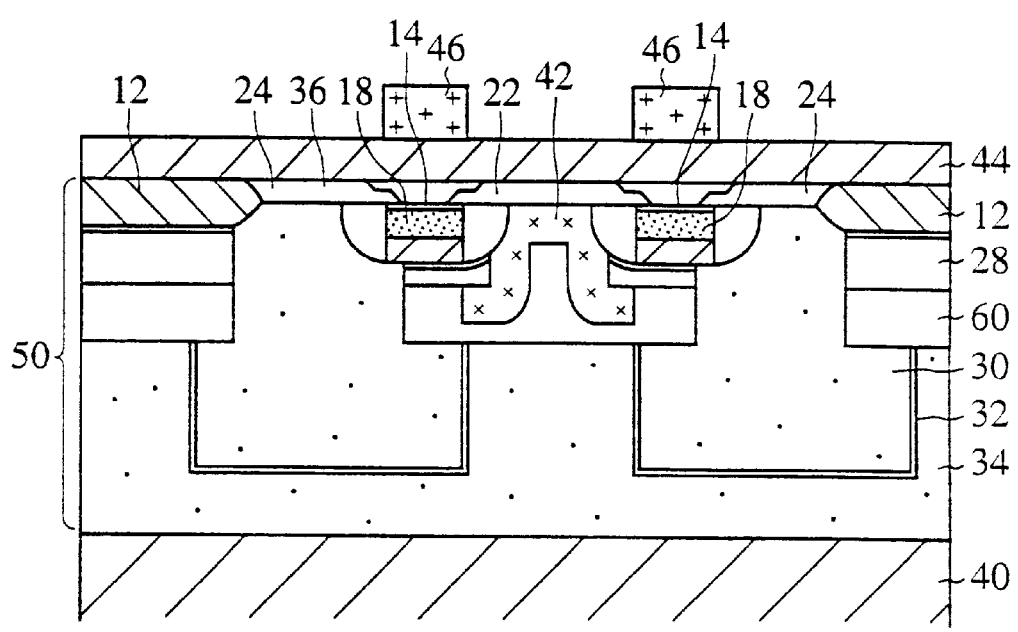
FIG. 14 is a diagrammatic sectional view of the semiconductor memory device according to a third embodiment of the present invention, which shows a structure thereof.

FIG. 14 is a diagrammatic sectional view of the semiconductor memory device according to the present embodiment, which explains a structure thereof. FIGS. 15 to 18 are sectional views of the semiconductor memory device according to the present embodiment on the steps of the method for fabricating the same, which explain the method.

The semiconductor memory device according to the present embodiment is characterized in that bit lines are formed on the side of a semiconductor layer 36 on which capacitors are formed. That is, the bit lines 42 formed below the semiconductor layer 36 are connected to the undersides of source diffused regions 22 of memory cell transistors (FIG. 14).

Then, the method for fabricating the semiconductor memory device according to the present embodiment will be explained.

Figure 15A:
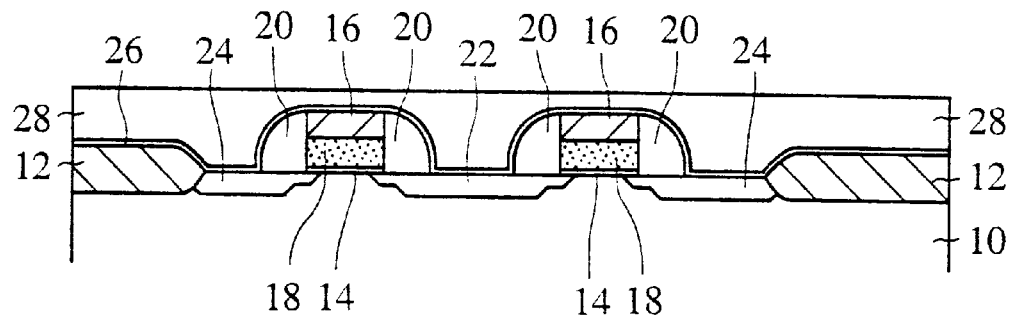
FIGS. 15A to 15C are sectional views of the semiconductor memory device according to the third embodiment, which explain the method (Part 1).

First, in the same way as in the method for fabricating the semiconductor memory device according to the first embodiment shown in FIG. 2, memory cell transistors and an insulating film 28 are formed on a silicon substrate 10 (FIG. 15A).

Figure 15B:
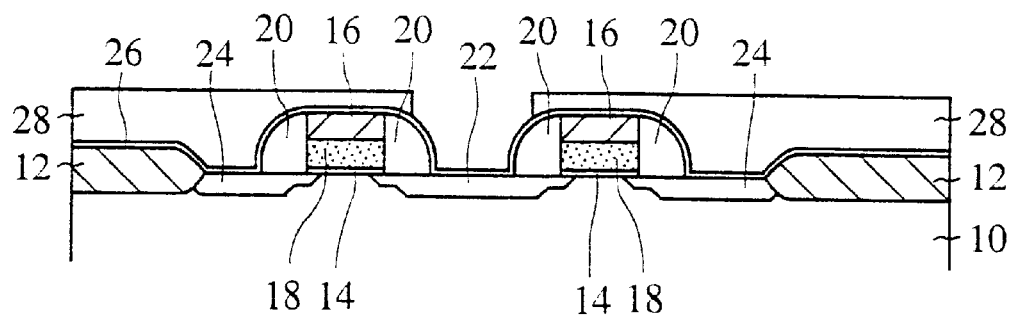

Then, openings are formed in the insulating film 28 on the source diffused region 22 of the memory cell transistors (FIG. 15B.

Figure 15C:
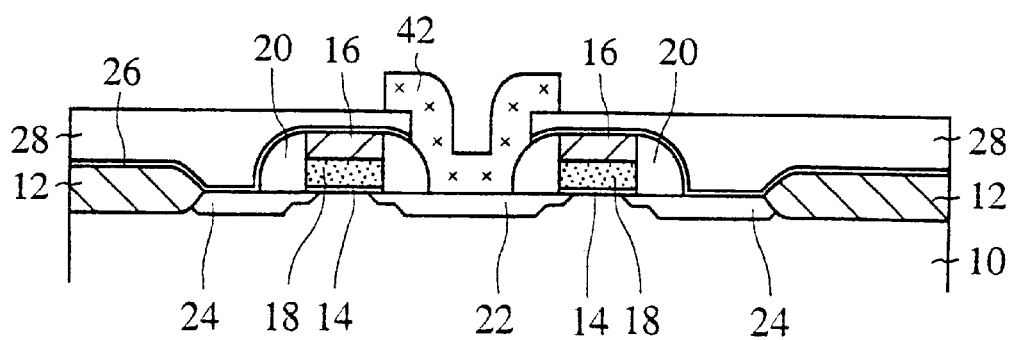

The silicon nitride film remaining on the bottoms of the openings is etched off by, e.g., a boiled phosphoric acid solution, and the openings reach the surface of the source diffused region 22. Then, a polycrystal silicon film, for example, is deposited by CVD and patterned to form the bit lines 42 connected to the source diffused region 23 (FIG. 15C). FIG. 15C shows parts of the bit lines 42 in the regions where the bit lines 42 are connected to the source diffused region 22, but the bit lines 42 are extended perpendicular to word lines 18.

Then, a silicon oxide film, for example, is deposited by CVD to form an insulating film 60, and the surface of the insulating film 60 is planarized by CMP.

Then, openings are formed in the insulating films 28, 60 on the drain diffused region 24 of the memory transistors.

Figure 16A:
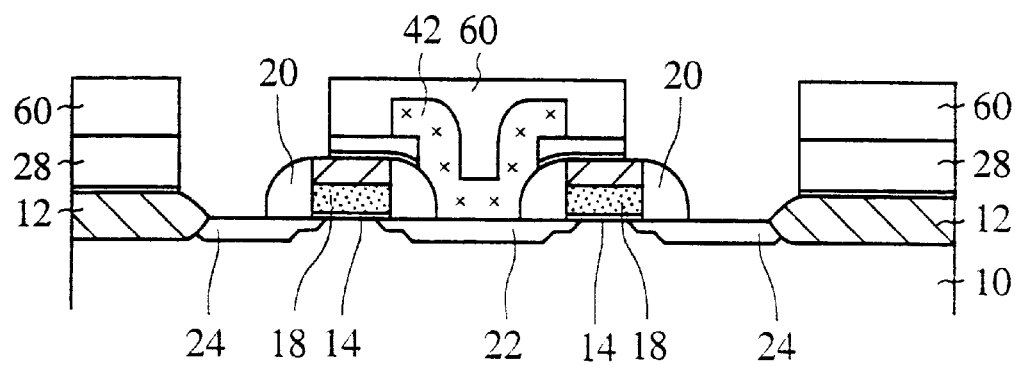
FIGS. 16A and 16B are sectional views of the semiconductor memory device according to the third embodiment, which explain the method (Part 2).

Subsequently the silicon nitride film 26 remaining on the bottoms of the openings is etched off by, e.g., a boiled phosphoric acid solution, and the openings arrive at the surface of the drain diffused region 24 (FIG. 16A).

Then, a polycrystal silicon film, for example, is deposited by CVD and patterned to form storage nodes 30 connected to the drain diffused region 24.

Next, an insulating film to be capacitor dielectric film 32 is formed on the surfaces of the storage nodes 30. Subsequently, a polycrystal silicon film, for example, is deposited by CVD to form a cell plate 34. Thus capacitors are formed.

Figure 16B:
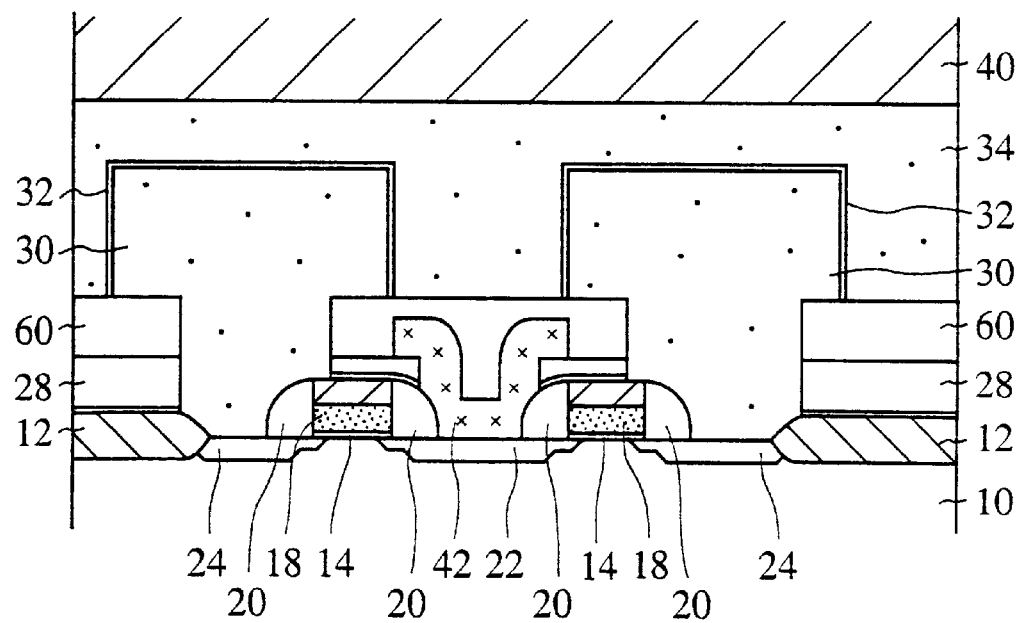

Then, the surface of the cell plate 34 is planarized by CMP, and a support substrate 40 is adhered to the planarized surface (FIG. 16B).

Then, the silicon substrate 10 is polished by CMP on the backside of the silicon substrate 10. At this time, the device isolation film 12 functions as the stopper, and the polishing is finished when the device isolation film 12 is exposed.

Figure 17A:
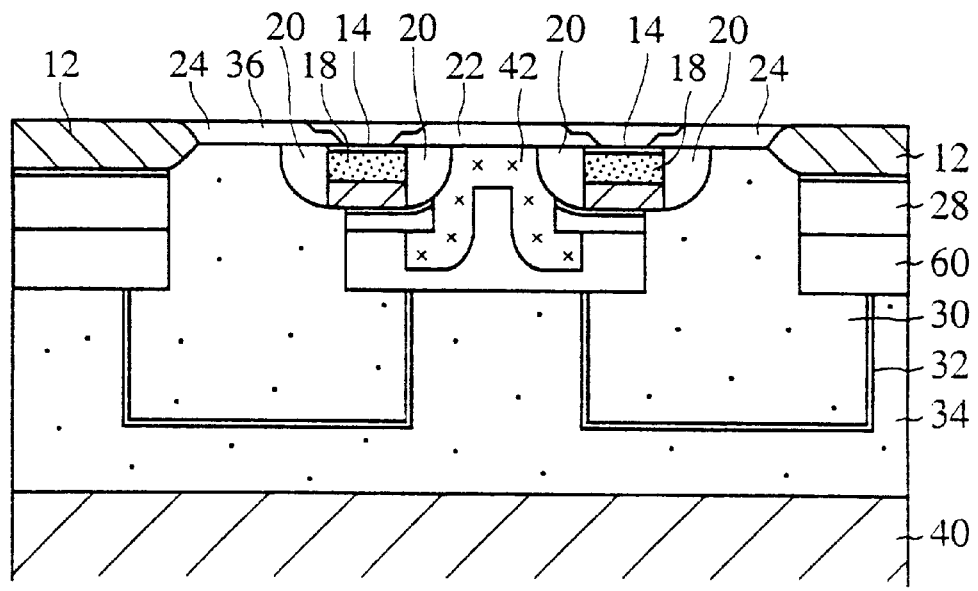
FIGS. 17A and 17B are sectional views of the semiconductor memory device according to the third embodiment, which explain the method (Part 3).

By thus polishing the silicon substrate 10, the semiconductor layer 36 with the source diffused region 22 and the drain diffused region 24 formed in is perfectly divided into regions defined by the device isolation film 12 (FIG. 17A).

Figure 17B:
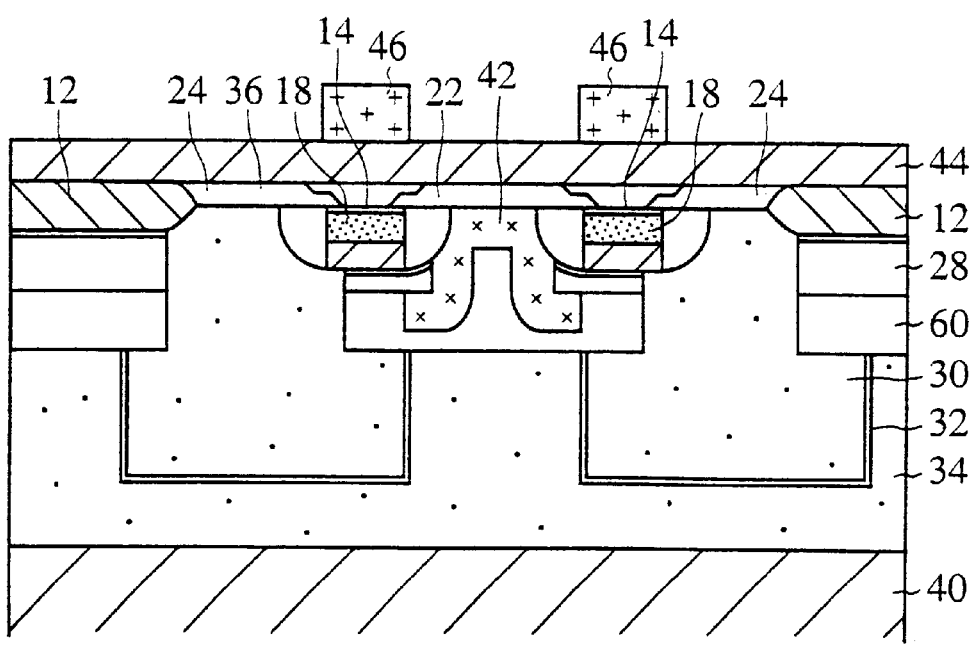

Subsequently a silicon oxide film, for example, is deposited by CVD to form an insulating film 44, and strapping word lines 46 are formed on the insulating film 44 (FIG. 17B).

The strapping word lines 46 can be formed by the steps exemplified in FIG. 18.

Figure 18A:
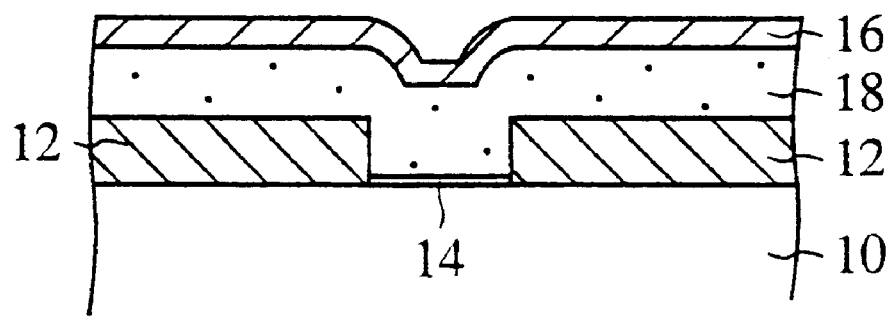
FIGS. 18A and 18B are sectional views of the semiconductor memory device according to the third embodiment, which explain the method (Part 4).

First, before formation of the gate electrodes 18, openings are formed in the device isolation film 12 in regions where the gate electrodes 18 and the strapping word lines are connected to each other so that the gate electrodes 17 are buried in the openings (FIG. 18A). The openings may be formed simultaneously with formation of the device isolation film 12 or formed by etching in a following step.

Then, a device layer 50 is adhered to the support substrate 10, and next contact holes are formed in the insulating film 44 on the openings formed in the device isolation film 12 to expose the gate electrodes 18 in the contact holes in the insulating film 44.

Figure 18B:
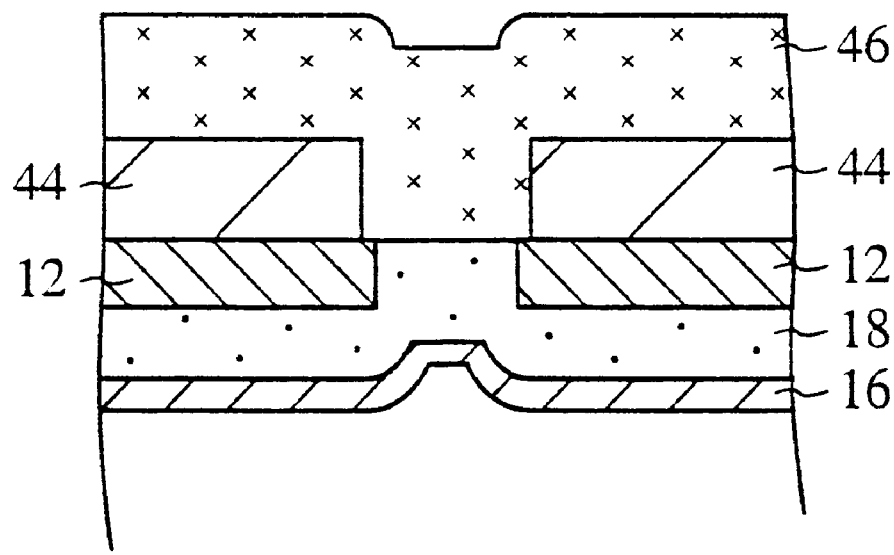
Figure 19:
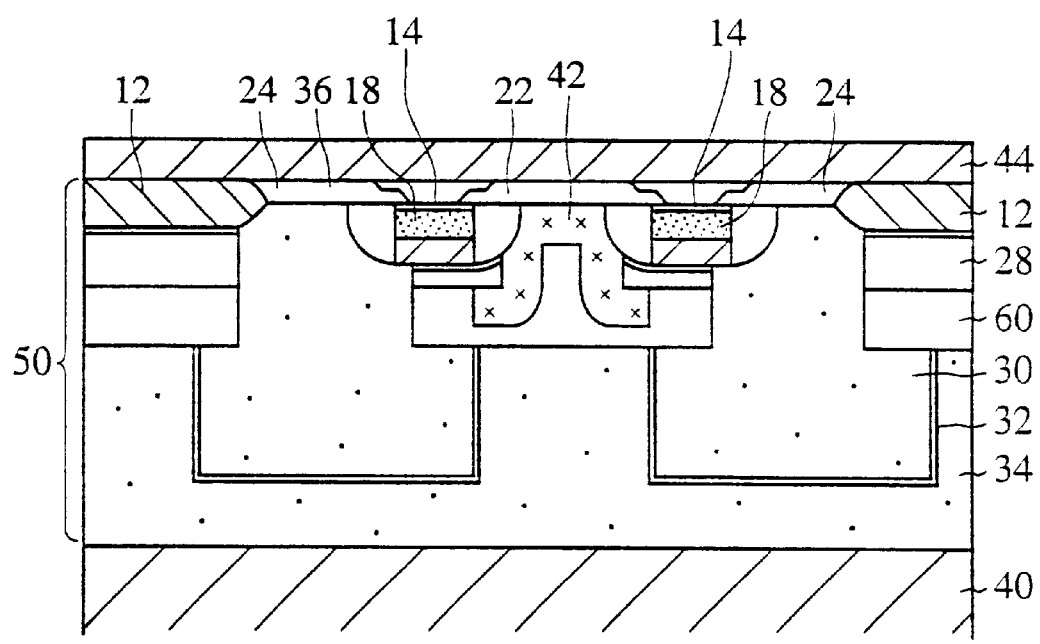
FIG. 19 is a diagrammatic sectional view of a variation of the third embodiment, which shows a structure thereof (Part 1).

Subsequently the strapping word lines 46 are formed on the insulating film 44 and are connected to the gate electrodes 18 (FIG. 18B).

Thus the strapping word lines 46 are formed.

As described above, according to the present embodiment, the planarization step in the bonded SOI technique and the planarization step in the DRAM fabrication process can be rationalized, whereby in the case that the bit lines 42 are formed on the side of the semiconductor layer 36 on which the capacitors are formed, fabrication costs can be much reduced.

The semiconductor memory device according to the present embodiments include the strapping word lines 46 but, as shown in FIG. 9, may not include the strapping word lines 46.

In the present embodiment, the capacitors are formed after the bit lines 42 are formed, but the bit lines 42 may be formed after the capacitors are formed.

In transistors formed on an SOI layer, the semiconductor layer directly below the gates, i.e., generally a body is electrically floating and is unstable in potential. In the semiconductor memory device according to the present embodiment, however, contacts for releasing charges accumulated in the body can be very easily formed.

Figure 20:
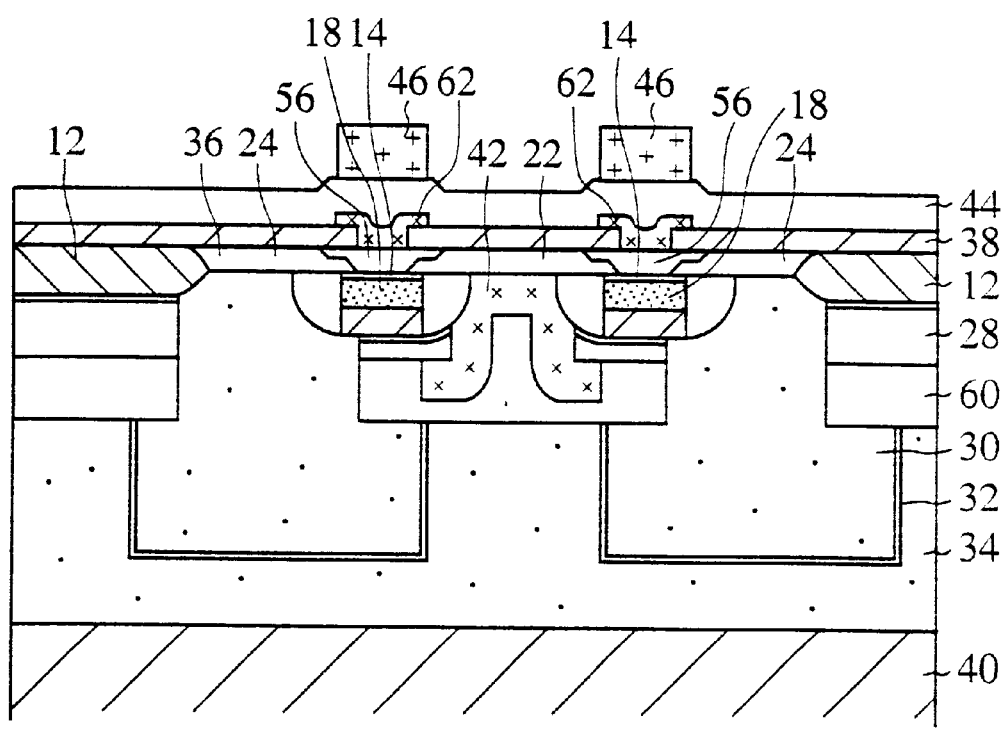
FIG. 20 is a diagrammatic sectional view of a variation of the third embodiment, which shows a structure thereof (Part 2).

For example, the semiconductor memory device shown in FIG. 20, electrodes 62 connected to a body 56 are formed after the insulating film 38 is formed on the semiconductor layer 36.

By thus providing the electrodes 62 connected to the body 56, a trace of charge accumulated in the body 56 can be released, whereby the body 56 can have a stable potential.

[A Fourth Embodiment]

The semiconductor memory device according to a fourth embodiment of the present invention and the method for fabricating the same will be explained with reference to FIGS. 21 to 24. The same members of the present invention as the semiconductor memory device according to the third embodiment and the method for fabricating the same are represented by the same reference numerals so as not to repeat or to simplify their explanation.

Figure 21:
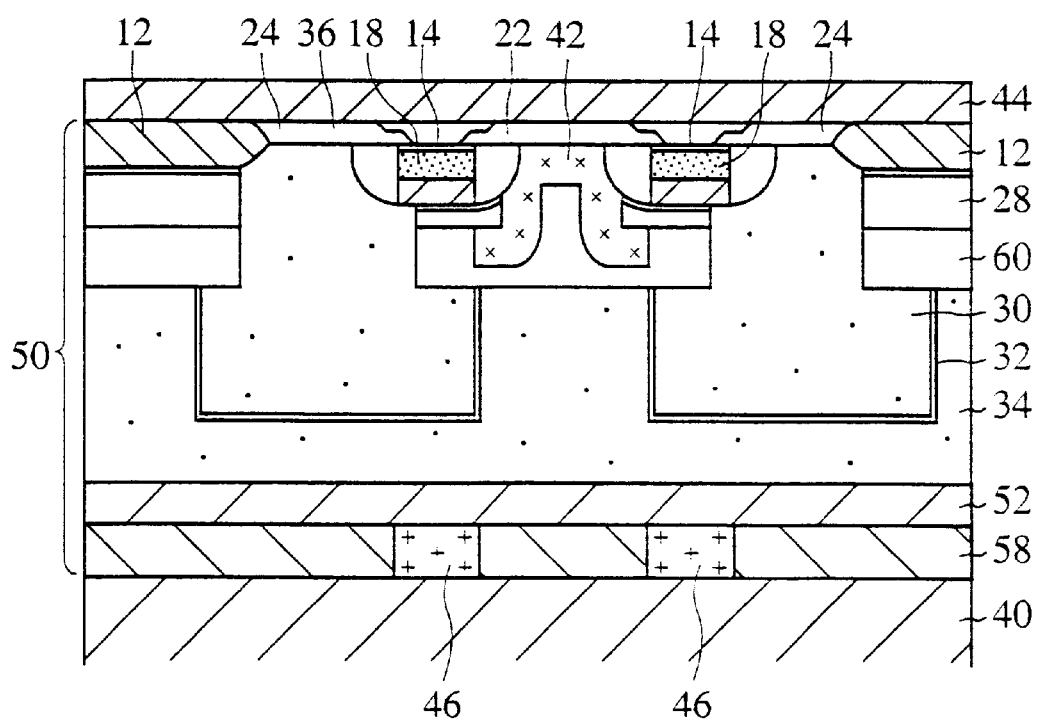
FIG. 21 is a diagrammatic sectional view of the semiconductor memory device according to a fourth embodiment of the present invention, which shows a structure thereof.

FIG. 21 is a diagrammatic sectional view of the semiconductor memory device according to the present invention. FIGS. 22 to 24 are sectional views of the semiconductor memory device according to the present embodiment on the steps of the method for fabricating the same, which explain the method.

The semiconductor memory device according to the present embodiment is characterized in that the semiconductor memory device according to the third embodiment includes strapping word lines 46 formed on the side of a support substrate 40.

That is, bit lines 42 are connected to a source diffused region 22 of memory cell transistors on the side of a semiconductor layer 36 which is nearer to a support substrate 40. Strapping word lines 46 for decreasing electric resistances of word lines are formed below a cell plate 34 through an insulating film 52. The strapping word lines 46 are connected to gate electrodes 18 at a certain pitch (FIG. 21).

Next, the method for fabricating the semiconductor memory device according to the present embodiment will be explained.

Figure 22A:
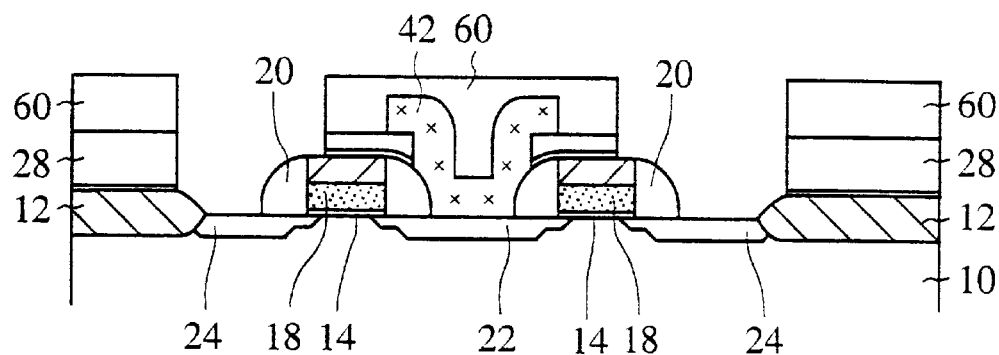
FIGS. 22A and 22B are sectional views of the semiconductor memory device according to the fourth embodiment of the present invention, which show the method (Part 1).

First, the memory cell transistors and the bit lines 42 are formed on a silicon substrate 10 in the same way as in the method for fabricating the semiconductor memory device according to the third embodiment shown in FIGS. 15A to 16A (FIG. 22A).

Then, capacitors comprising storage nodes 30, a capacitor dielectric film 32 and the cell plate 34 are formed in the same way as in the method for fabricating the semiconductor memory device according to the third embodiment.

The surface of the cell plate 34 is planarized by CMP, and then a silicon oxide film, for example, is deposited by CVD to form the insulating film 52.

Then, the strapping word lines 46 are formed through the insulating film 52.

Figure 22B:
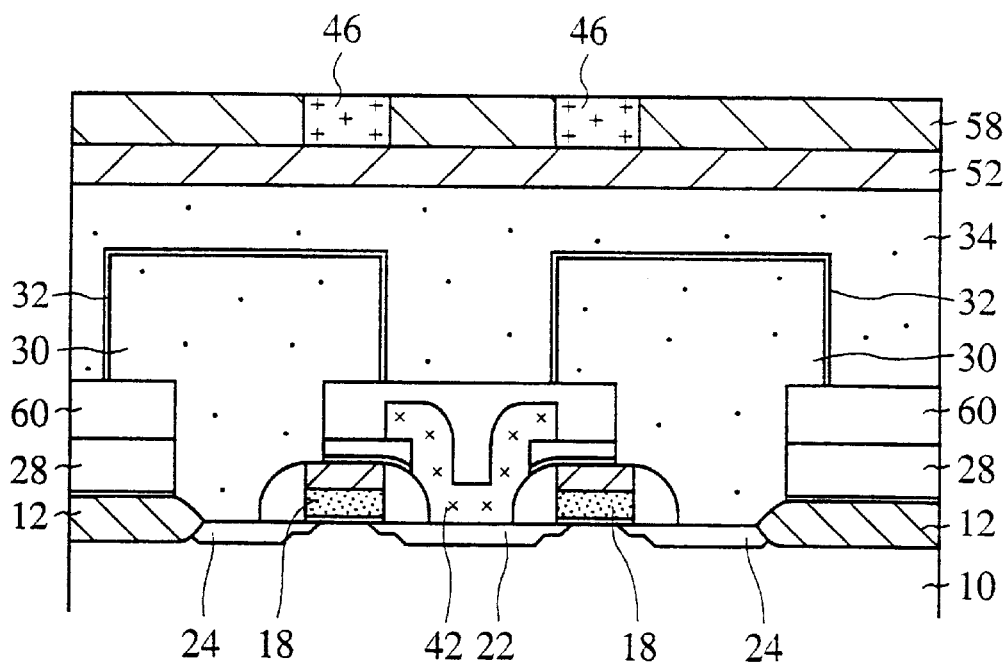

Next, a silicon oxide film, for example, is deposited on the strapping word lines 46 to form an insulating film 58, and the surface of the insulating film 58 is planarized (FIG. 22B). The strapping word lines 46 can be connected to the gate electrodes 18 by the same steps as those of the method for fabricating the semiconductor memory device according to the second embodiment, which are shown in FIGS. 13 and 14.

After the support substrate 40 is adhered to the insulating film 58, the silicon substrate 10 is polished by CMP on the backside of the silicon substrate 10. At this time, a device isolation film 12 functions as the stopper, and the polishing is finished when the device isolation film 12 is exposed.

Figure 23A:
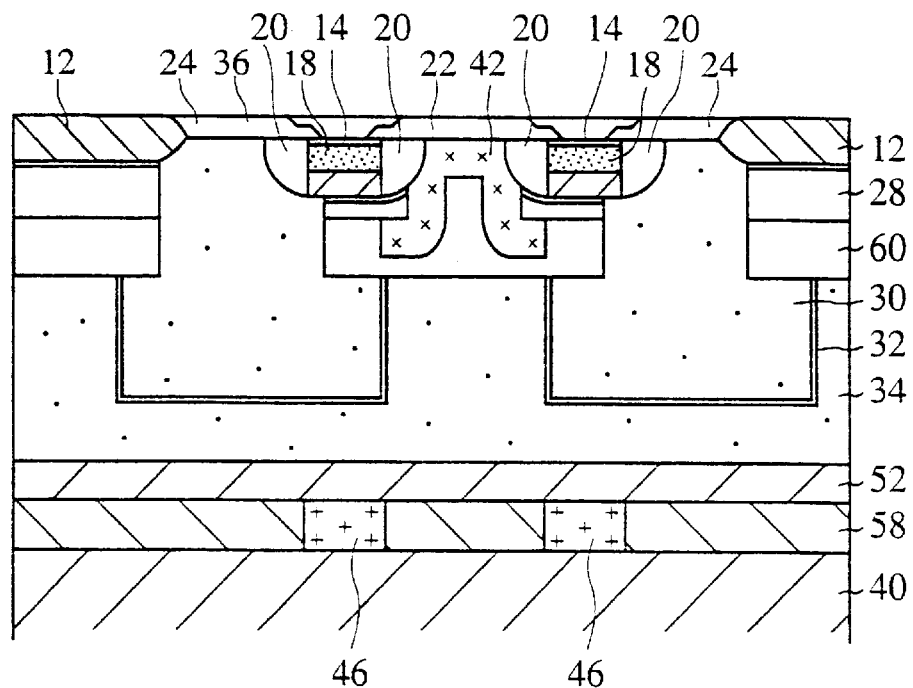
FIGS. 23A and 23B are sectional views of the semiconductor memory device according to the fourth embodiment of the present invention, which show the method (Part 2).
Figure 24:
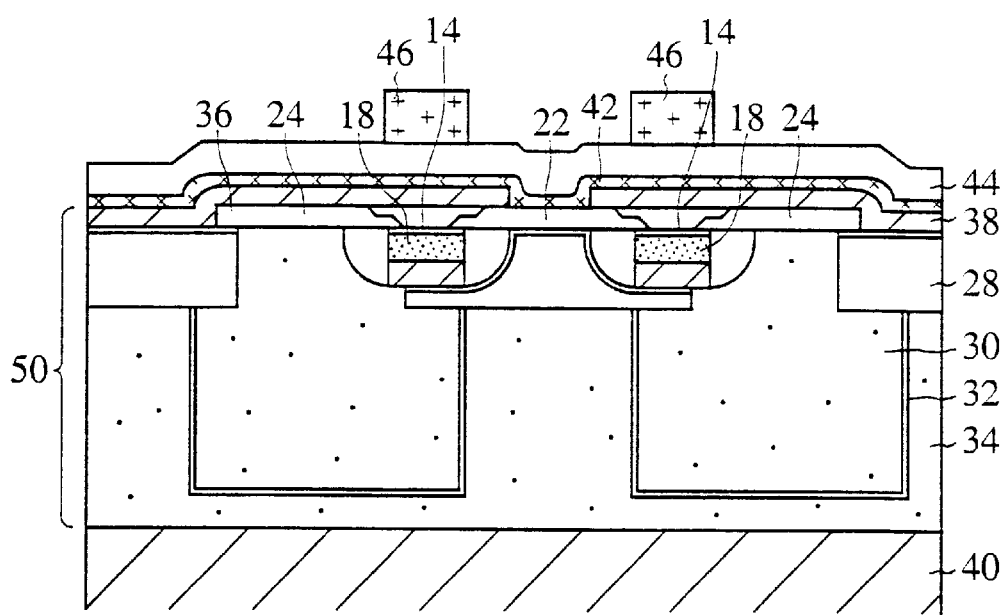
FIG. 24 is a diagrammatic sectional view of the semiconductor memory device according to a fifth embodiment of the present invention, which shows a structure thereof.
Figure 25A:
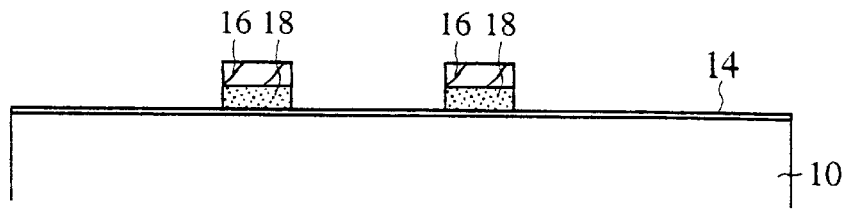
FIGS. 25A to 25D are sectional views of the semiconductor memory device according to the fifth embodiment of the present invention, which show the method (Part 1).
Figure 25B:
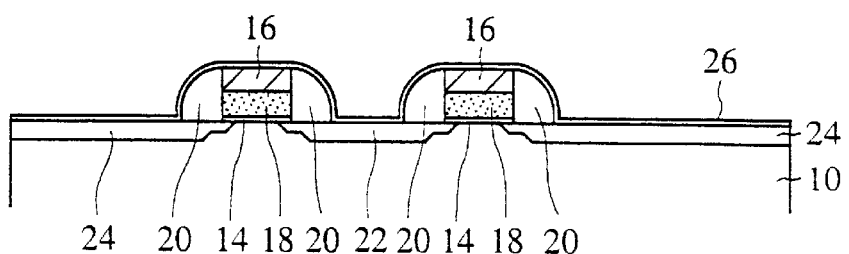
Figure 25C:
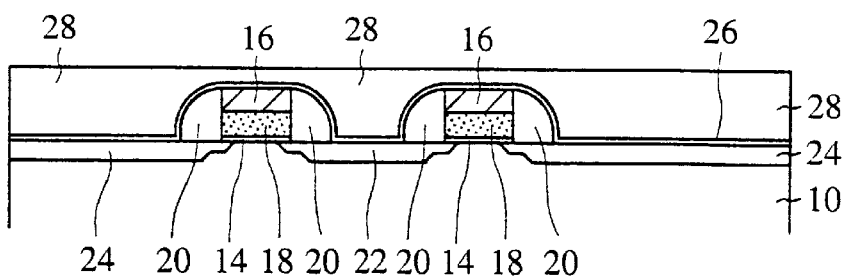
Figure 25D:
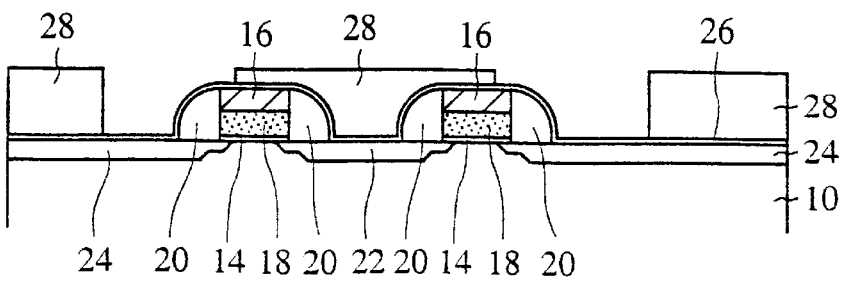
Figure 26A:
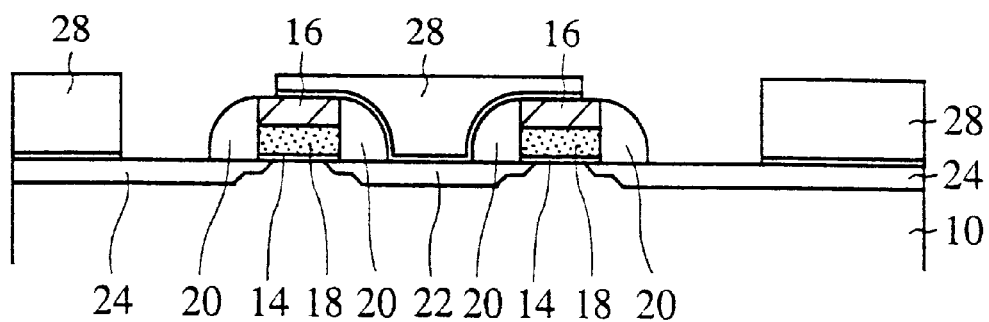
FIGS. 26A and 26B are sectional views of the semiconductor memory device according to the fifth embodiment of the present invention, which show the method (Part 2).
Figure 26B:
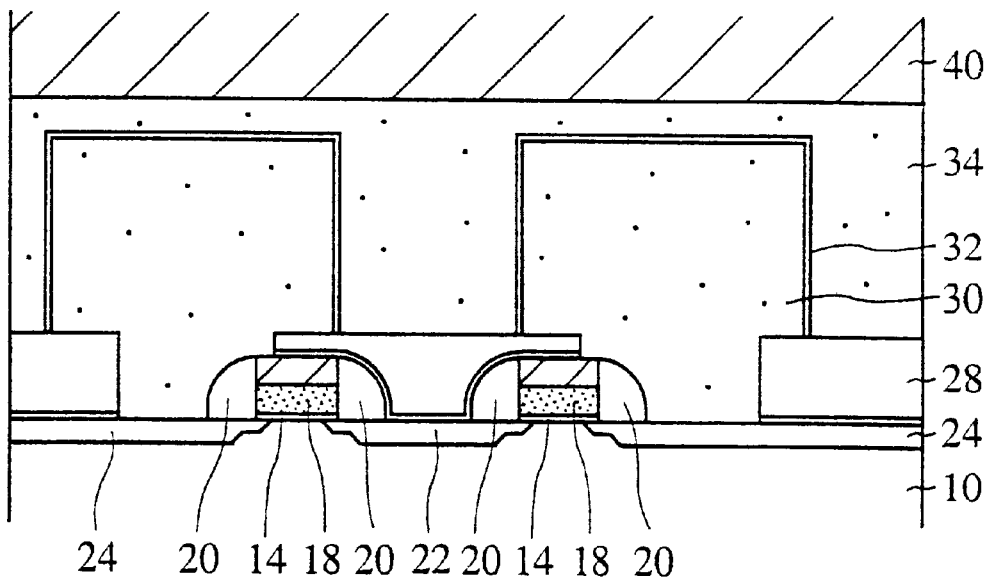

By thus polishing the silicon substrate 10, the semiconductor layer 36 with the source diffused region 22 and the drain diffused region 24 formed in is perfectly divided in regions defined by the device isolation film 12 (FIG. 23A).

Figure 23B:
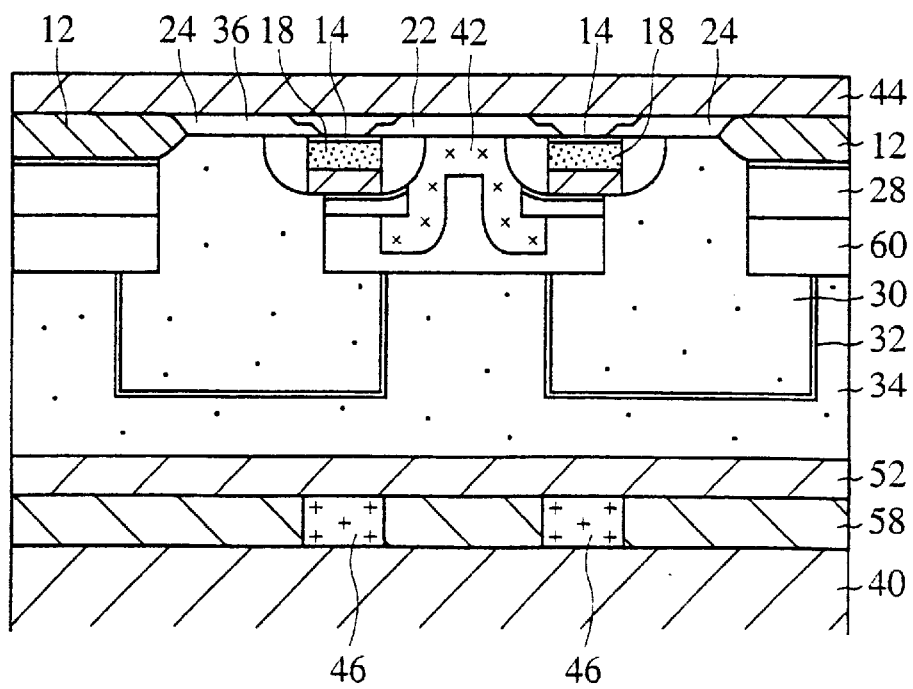

Subsequently, a silicon oxide film, for example, is deposited by CVD to form an insulting film 44 (FIG. 23B).

As described above, according to the present embodiment, the planarization step in the bonded SOI technique and the planarization step in the DRAM fabrication process can be rationalized, whereby even in the case that the bit lines 42 and the strapping word lines 46 are formed on the side of the semiconductor layer 36 which is nearer to the support substrate 40, fabrication costs can be much decreased.

In the semiconductor memory device according to the present embodiment, in a case that it is preferred to form body contacts, the body contacts may be formed in the same way as in the semiconductor memory device according to one variation of the third embodiment exemplified in FIG. 20.

[A Fifth Embodiment]

The semiconductor memory device according to a fifth embodiment of the present invention and the method for fabricating the same will be explained with reference to FIGS. 24 to 27. The same members of the present embodiment as the semiconductor memory device according to the first embodiment and the method for fabricating the same are represented by the same reference numerals so as not to repeat or to simplify their explanation.

First, a structure of the semiconductor memory device according to the present embodiment will be explained with reference to FIG. 24.

The semiconductor memory device according to the present embodiment is characterized in that a semiconductor layer 36 is divided without the use a device isolation film.

That is, a source diffused region 22 and a drain diffused region 24 are formed independent of each other in a semiconductor layer 36 which is formed in isles and in a device layer 50. Gate electrodes 18 to be word lines are formed through a gate oxide film 14 below the semiconductor layer 36 between the source diffused region 22 and the drain diffused region 24. Storage nodes 30 formed of a polycrystal silicon re connected to the drain diffused region 24. A cell plate 34 is formed below the storage nodes 30 through a capacitor dielectric film 32. The storage nodes 30, the capacitor dielectric film 32 and the cell plate 34 form capacitors.

On the device layer 50 adhered to the support substrate 40 bit lines 42 connected to the source diffused region 22 through an insulating film 38. Strapping word lines 46 for decreasing electric resistance of the word lines are formed on the bit lines 42 through an insulating film 44. The strapping word lines 46 are connected to the gate electrodes 18 at a certain pitch.

Thus a DRAM comprising one-transistor and one-capacitor memory cells is arranged on the support substrate 40.

Then, the method for fabricating the semiconductor memory device according to the present embodiment will be explained.

Without forming the device isolation film 12 on the silicon substrate 10, a gate oxide film 14 of an about 5 nm-thickness is formed by thermal oxidation.

Then, the memory cell transistors and the capacitors are formed on the silicon substrate 10 by the same steps of the method for fabricating the semiconductor memory device according to the first embodiment shown in FIGS. 2B to 3C, and the support substrate is adhered to the cell plate 34 (FIG. 25A to 26B. The method for fabricating the semiconductor memory device according to the present embodiment is the same as the first embodiment except that the device isolation film 12 is not formed.

Then, the silicon substrate 10 is polished off the underside of the silicon substrate 10 to expose the source diffused region 22 and the drain diffused region 24.

In the method for fabricating the semiconductor memory device according to the present embodiment, the device isolation film cannot be used as the stopper for the polishing, and means for stopping the polishing when the source diffused region 22 and the drain diffused region 24 are exposed must be provided. The means can be specifically a method in which the polishing is conducted while thicknesses of the silicon substrate 19 are measured, and the polishing is stopped when the silicon substrate 19 has a prescribed thickness; a method in which a polishing machine having good reproducibility is used to polish the silicon substrate 19 to a prescribed thickness under prescribed conditions; a method in which a stopper is provided in the rest region except the memory cell region; or other method.

Figure 27A:
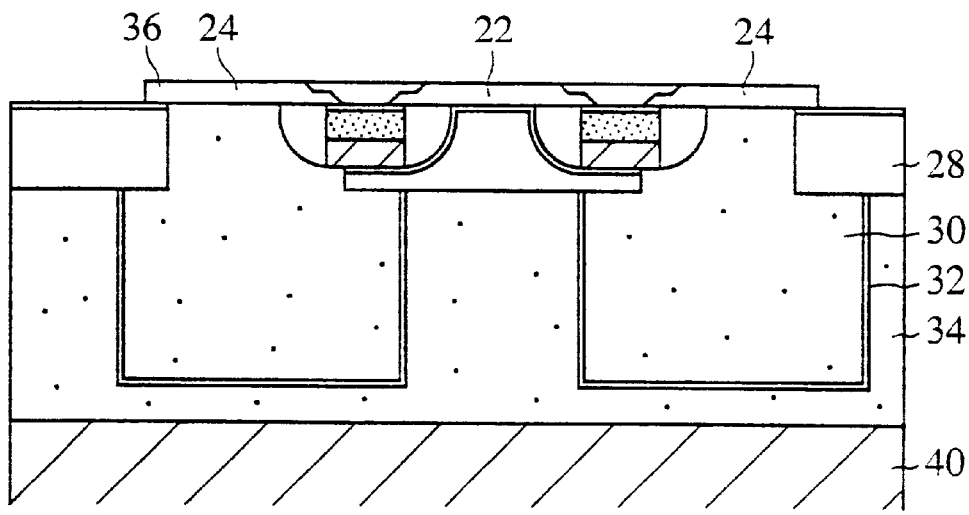
FIGS. 27A and 27B are sectional views of the semiconductor memory device according to the fifth embodiment of the present invention, which show the method (Part 3).

Subsequently, for device isolation, the semiconductor layer 36 in the device isolation regions is etched off. By thus etching the semiconductor layer 36, isles of the semiconductor layer 36 where the source diffused region 22 and the drain diffused region 24 are formed (FIG. 27A).

A reason why the device isolation film is not formed by the usual LOCOS method in the present embodiment is as follows.

That is, in the usual LOCOS method, thermal oxidation is conducted using a silicon nitride film as a mask. In the oxidation step, oxygen intrudes below the silicon nitride film, and so-called bird beaks are formed. If the device isolation is possible without the device isolation by LOCOS method, it is not necessary to consider bird beaks which hinder micronization of the device, which is very advantageous to micronization of the device.

Subsequently the insulating film 38 with openings on the source diffused region 22 is formed, and the bit lines 42 are formed.

Figure 27B:
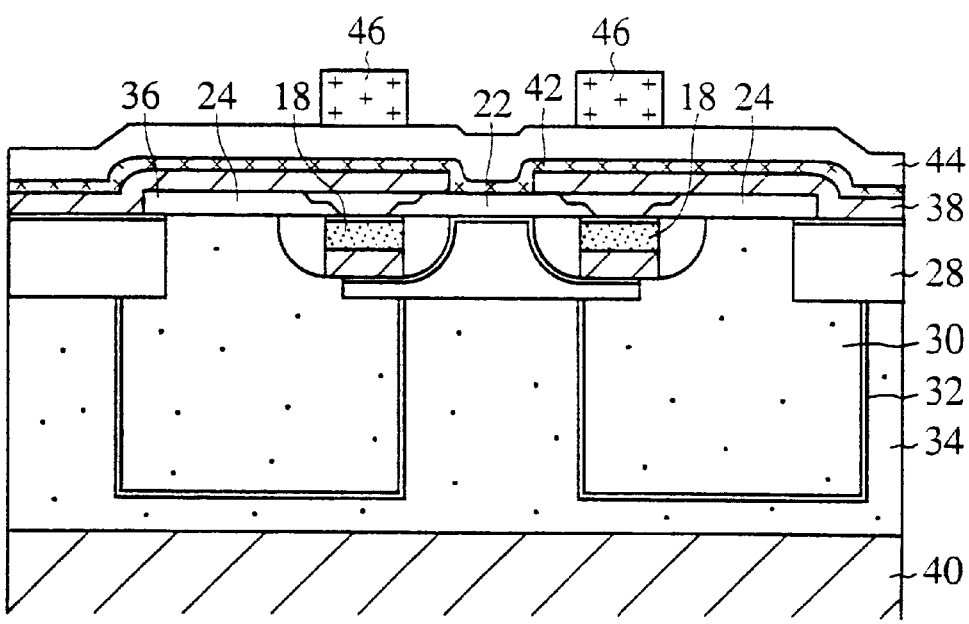

Then, the strapping word lines 46 are formed on the bit lines 42 through the insulating film 44 (FIG. 27B).

As described above, according to the present embodiment, the semiconductor layer is divided in devices without forming a device isolation film in the memory cell regions by LOCOS, whereby cell size expansion due to extension of bird beaks can be prevented. As a result, higher device integration can be obtained.

The present embodiment is an application of the method for fabricating the semiconductor memory device without device isolation by LOCOS or others to the first embodiment but is also applicable to the semiconductor memory device according to the first to the fourth embodiments.

In the present embodiment, embodiment, the semiconductor layer 36 in the region without the transistors formed in is removed to thereby isolate devices, but in place of removal of the semiconductor layer 36, it is possible that an impurity which is of a different type from the source diffused region 22 and the drain diffused region 24 is implanted to thereby isolate devices by p-n junction.

The DRAMs according to the first to the fifth embodiments include capacitors having the storage nodes arranged in convexities, but the structure of the capacitors is not limited to that of the first to the fifth embodiments. For example, capacitors having the storage nodes laid one on another, the so-called fin structure may be used, or capacitors of a cylinder structure may be used. Capacitors having the storage nodes which utilize the inside walls of openings in the inter-layer insulation film may be used.

The steps for connecting the word lines with the strapping word lines are not limited to those used in the present embodiment.

The present embodiment relates to the semiconductor memory device including N-memory cell transistors including N-memory cell transistors, and the method for fabricating the same, but the device and the method are applicable to semiconductor memory devices including inverse conduction-type devices.

In the present embodiment silicon substrates are used, but compound semiconductor substrates, as of GaAs or others, may be used.

The polishing for the planarization is not limited to that used in the present embodiment.

[A Sixth Embodiment]

The semiconductor memory device according to a sixth embodiment of the present invention and the method for fabricating the same will be explained with reference to FIGS. 30 and 31. The same members of the present embodiment as the semiconductor memory device according to the first embodiment shown in FIG. 1 and the method for fabricating the same are represented by the same reference numerals so as not to repeat or to simplify their explanation.

Figure 30:
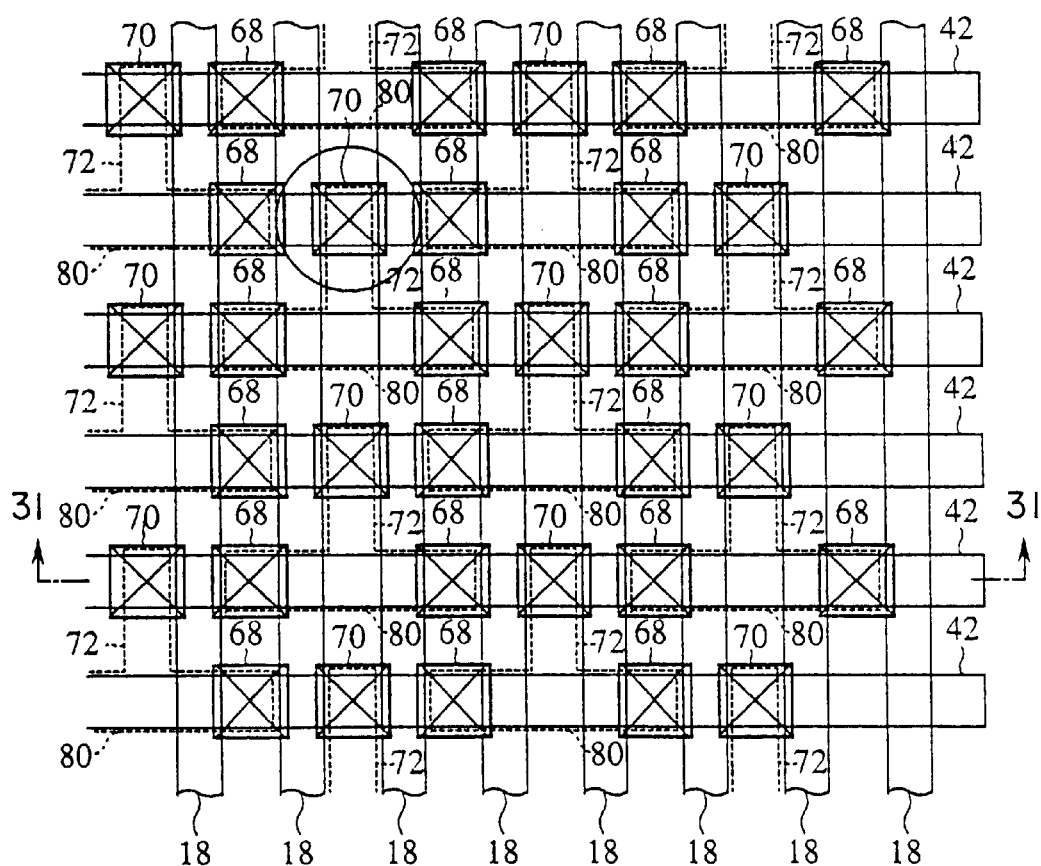
FIG. 30 is a plan view of the semiconductor memory device according to a sixth embodiment of the present invention, which shows a structure thereof
Figure 31:
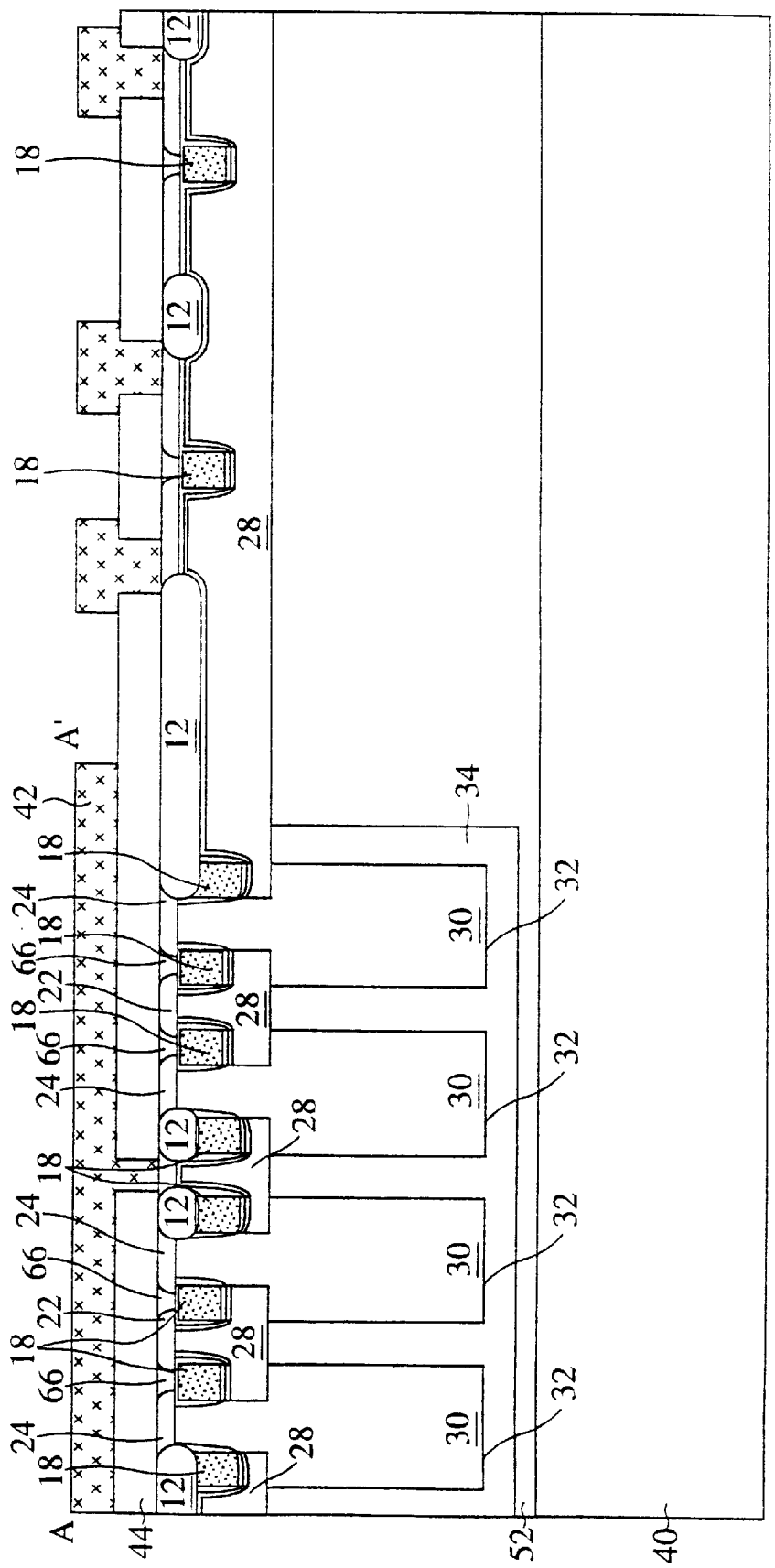
FIG. 31 is a diagrammatic sectional view of the semiconductor memory device of FIG. 30 along the 31—31 part.

FIG. 30 is a plan view of the semiconductor memory device according to the present embodiment, which show a structure thereof. FIG. 31 is a diagrammatic sectional view of the semiconductor memory device of FIG. 30 along the line 3–31.

In the semiconductor memory device according to the first, the second and the fifth embodiment and the method for fabricating the same, the bit lines 42 are formed on the side of the semiconductor layer 36 on which the gate electrodes are not formed. In fabricating the semiconductor memory device by the processes, however, the lithography steps for opening the contact holes of the bit lines has poor alignment precision.

Causes for the poor alignment precision will be detailed with reference to FIGS. 28 and 29.

Figure 28:
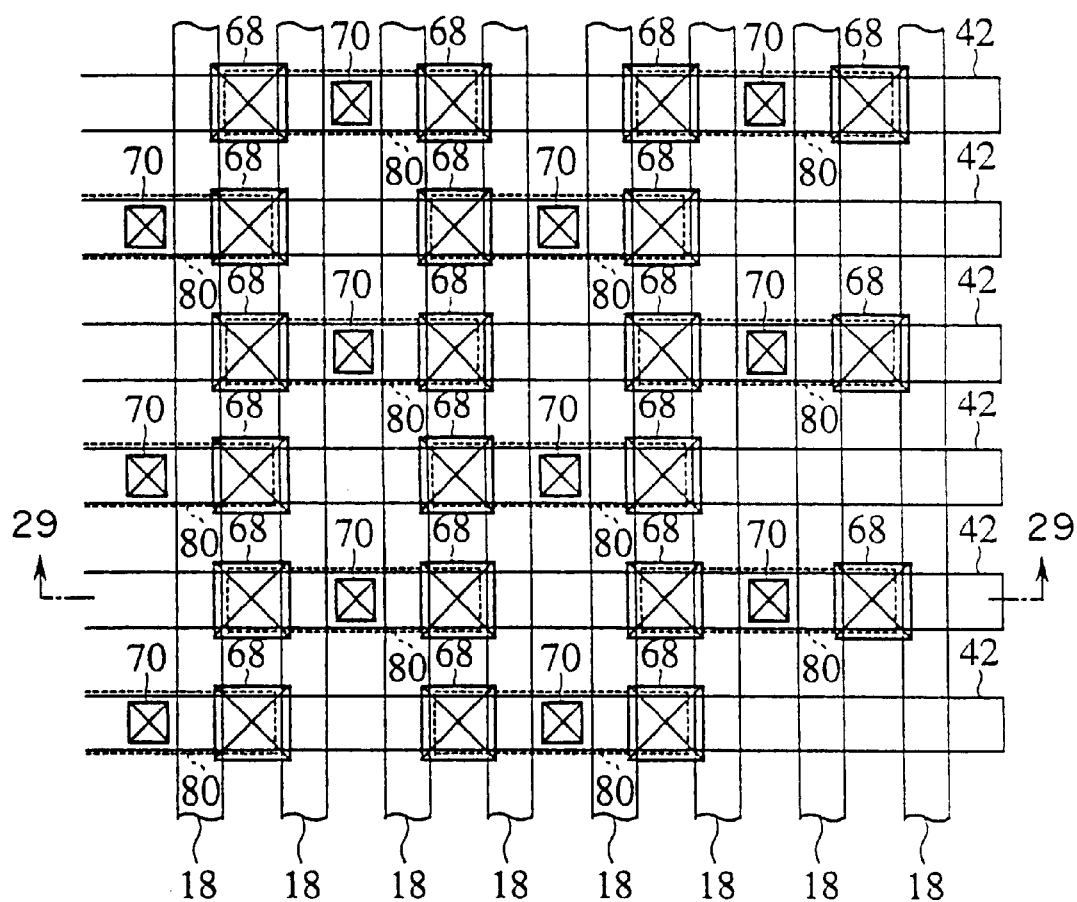
FIG. 28 is a plan view of the semiconductor memory device according to the first embodiment of the present invention, which shows the structure thereof.
Figure 29:
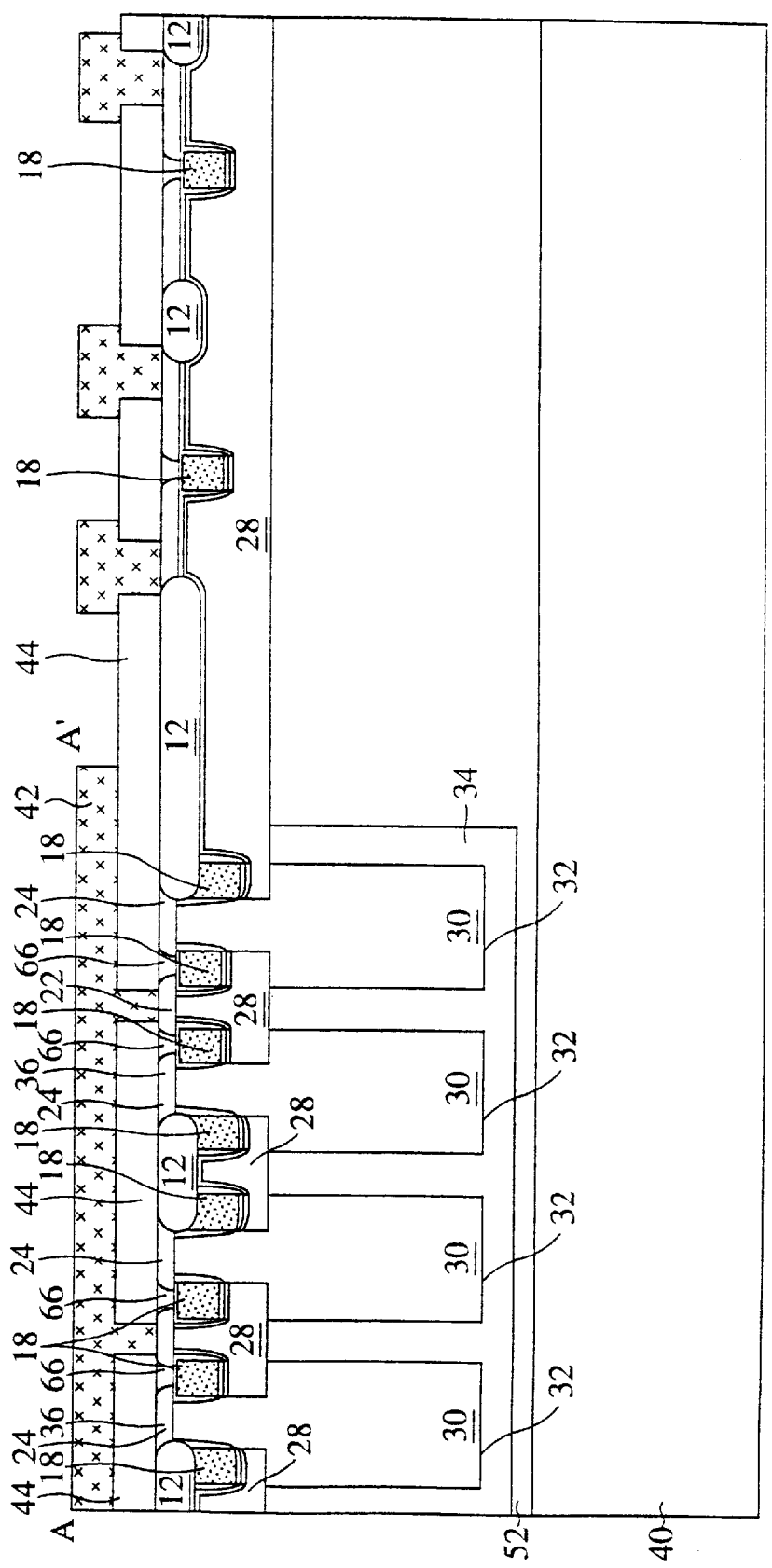
FIG. 29 is a diagrammatic sectional view of the semiconductor memory device of FIG. 28 along the 29—29 part.

FIG. 28 is a plan view of the semiconductor memory device according to the first embodiment, which shows its structure. FIG. 29 is a diagrammatic sectional view of the semiconductor memory device of FIG. 28 along the line 29—29.

A plurality of word lines 18 which are parallel with each other are formed on one side of the semiconductor layer 36. A plurality of bit lines 42 which are parallel with each other and are perpendicular to the word lines 18 are formed on the other side of the semiconductor layer 36.

The word lines 18 form the gate electrodes at the respective intersections between the word lines 18 and the bit lines 42, and memory cell transistors having the semiconductor layer 36 on the word lines 18 as the channel regions 66 are formed. The source diffused region 22 of the memory cell transistors is connected to the bit lines 42 through the contact holes 70 opened in the insulating film 44. The drain diffused region 24 of the memory cell transistors is connected to the storage nodes 30 through the contact holes 68 opened in the insulating film 28.

Here, the so-called SAC (Self-Aligned Contact) is applicable to the contact holes 68 which are opened in the insulating film 28 for connecting the drain diffused region 24 to the storage nodes 30.

That is, the silicon oxide film 16 covering the word lines 18, and the silicon nitride film 26 covering the sidewall oxide film 20 are formed, and the contact holes are opened with the silicon nitride film 26 as the etching mask, whereby the contact holes can be opened without removing the silicon oxide film 16 and the sidewall oxide film 20 (FIGS. 2D to 3B).

The contact holes 68 are formed by self-alignment with the word lines 18, so that even when a little disalignment occurs in the lithography step for forming the pattern of the contact holes 69, the contact holes 68 can be opened in the prescribed regions.

By thus forming the contacts by self-alignment, the pattern of the contact holes 68 and the pattern of the word lines 18 can be laid one on another, and it is not necessary to allow an alignment margin for opening the contact holes 68. The word lines 18 can be arranged at a small pitch.

On the other hand, the contact holes 70 which connect the bit lines 42 with the source diffused region 22 are opened in the insulating film 44 on the semiconductor layer 36 planarized by polishing, and cannot be formed by SAC. In opening the contact holes 70, alignment is conducted with respect to the pattern of the device isolation film 12 exposed on the polished surface.

In the usual lithography in which alignment is conducted with respect to a surface pattern, the pattern must be arranged in consideration of dialignment. For example, for opening the contact holes 70, the source diffused region 22 must be formed wider including an alignment margin so that even when a dialignment occur in the direction of the bit lines 42, the contact holes 70 are not opened on the channel regions 66 of the memory cell transistors. Accordingly in the semiconductor memory device according to the first, the second and the fifth embodiments, it is difficult to micronize the bit line contacts.

The semiconductor memory device according to the present embodiment and the method for fabricating the same can easily form bit line contacts without increasing the memory cell area.

First, a structure of the semiconductor memory device according to the present embodiment will be explained with reference to FIGS. 30 and 31.

The semiconductor memory device according to the present embodiment is characterized in that contacts of bit lines are formed on device regions extended in the direction of word lines so that the bit contacts are sufficiently spaced from channel regions 66 of memory cell transistors.

That is, the device regions 80 defined by a device isolation film 12 has a T-shape having an arm 72 extended from regions where a source diffused region 22 is formed, in direction of word lines 42 (indicated by the dot lines in FIG. 30), and contact holes 70 of the bit lines 42 are opened on the branches 72.

By moving locations where the contact holes 70 for the bit lines 42 are opened toward the word lines 18, even when disalignment takes place in opening the contact holes 70, the contact holes 70 are not opened in the channel regions 66. Accordingly the word lines 18 sandwiching the source diffused region 22 can be laid out without considering an alignment margin.

Thus the semiconductor memory device according to the present embodiment can have substantially the same memory cell area as the semiconductor memory device (e.g., according to the third embodiment) in which the bit lines 42 are arranged on the other side of the semiconductor layer 36, and the contact holes for the bit lines 42 are formed by self-alignment.

In the present embodiment the arms 72 are provided in the device regions 80. The device regions 80, however, are regions which are not used in the usual memory cell arrangement, and the extension of the arms 72 does not add to the memory cell area.

The semiconductor memory device according to the present embodiment can be formed by the method for fabricating the semiconductor memory device according to the first embodiment in which simply the pattern of the device isolation film 12 and the opening pattern of the contact holes 70 are changed. Accordingly the memory cell size can be micronized.

As described above, according to the present embodiment, the device regions 80 in the parts where the source diffused region 22 is formed are extended in the direction of the word lines 18 to form the contact holes 70 spaced from the channel regions 66. Even when disalignment takes place in patterning the contact holes 70, connection between the bit lines 42 and the channel regions 66 can be prevented.

Furthermore, a distance between the word lines 18 and the source diffused region 22 can be small, whereby the contact holes 70 can be opened without failure without sacrificing a memory cell area.

In the above-described embodiment, the parts of the device regions 80, at which the source diffused region 22 is formed are extended toward the word lines 18. The semiconductor memory device according to the present embodiment is significant in that the contact holes 70 are opened in the regions which are spaced from the channel regions 66 and which are not used by the conventional memory cell arrangement. Accordingly the pattern of the device regions 80 is not limited to that of the semiconductor memory device according to the present embodiment.

For example, without forming the continuous device regions 80, wiring which connects the contacts of the bit lines 42 with the source diffused region 22 is formed, whereby the bit line contacts can be formed without adding to the memory cell area. Such example of the semiconductor memory device will be explained as a seventh embodiment of the present invention.

In the present embodiment, the device regions defined by the device isolation film 12 are formed in the T-shape, for example, and the present embodiment is applicable to the semiconductor memory device according to the fifth embodiment.

[A Seventh Embodiment]

The semiconductor memory device according to a seventh embodiment of the present invention and the method for fabricating the same will be explained with reference to FIGS. 32 to 34. The same members of the present embodiment as the semiconductor memory device according to the sixth embodiment and the method for fabricating the same shown in FIGS. 30 and 31 are represented by the same reference numerals so as not to repeat or to simplify their explanation.

Figure 32:
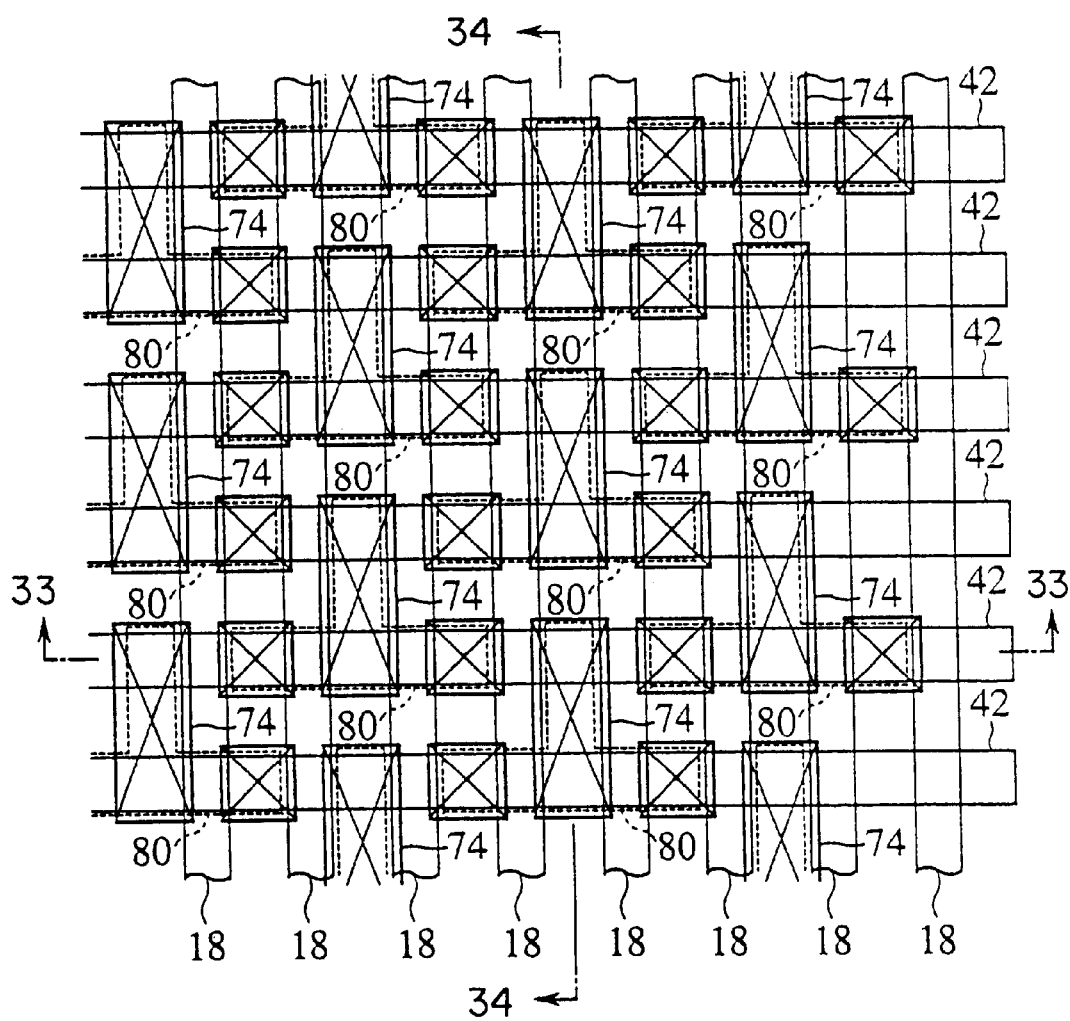
FIG. 32 is a plan view of the semiconductor memory device according to a seventh embodiment of the present invention, which shows a structure thereof.

FIG. 32 is a plan view of the semiconductor memory device according to the present embodiment, which shows a structure thereof. FIG. 33 is a diagrammatic sectional view of the semiconductor memory device according to the present embodiment, which shows the structure thereof. FIG. 34 is a diagrammatic sectional view of the semiconductor memory device according to the present embodiment, which shows the structure thereof. FIG. 35 is views of sectional views of the semiconductor memory device according to the present invention in the steps of the method for fabricating the same, which show the method.

The semiconductor memory device according to the present embodiment is characterized by the semiconductor memory device according to the sixth embodiment including buried plugs 74 formed below the source diffused region 22 to the arms 72 of the device regions 80 (FIG. 32).

Figure 33:
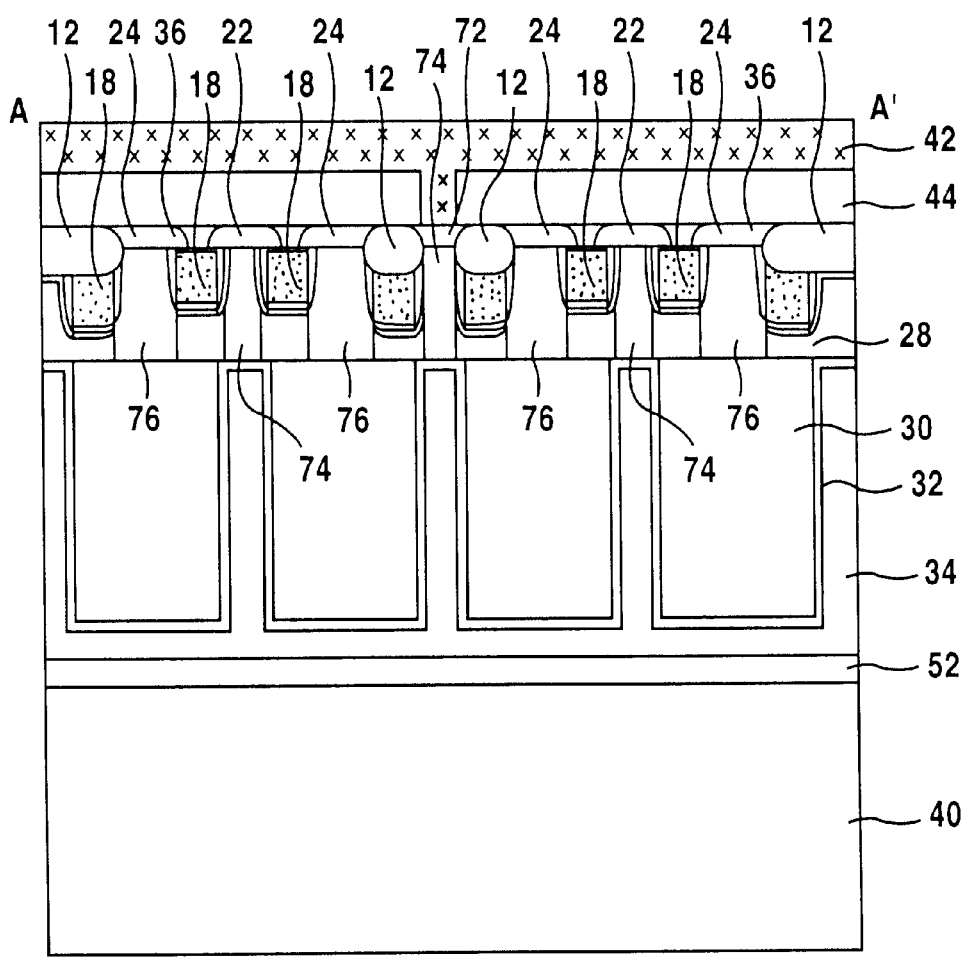
FIG. 33 is a diagrammatic sectional view of the semiconductor memory device of FIG. 32 along the part 33—33.
Figure 34:
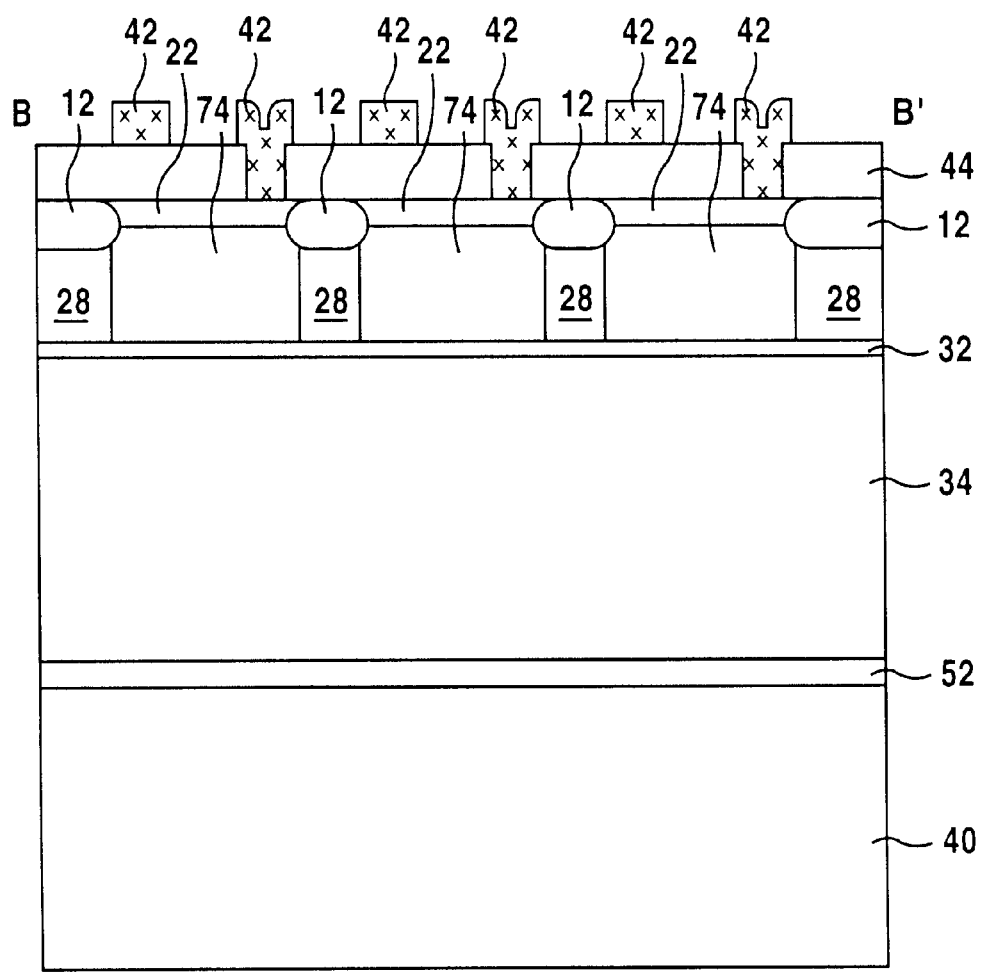
FIG. 34 is a diagrammatic sectional view of the semiconductor memory device of FIG. 32 along the 34—34 part.

That is, the buried plugs 74 are formed in through-holes opened in a source diffused region 22 and an insulating film 28 below arms 72 (FIG. 33).

The buried plugs 74 are formed so as to line the arms 72 of the device regions 80, and functions to decrease a diffused region resistance between the source diffused region 22 and bit lines 42.

Accordingly even in a case that contact holes 70 for the bit lines 42 are formed spaced from channel regions 66 as in the semiconductor memory device according to the sixth embodiment, the buried plugs 74 can compensate an increase of the diffused region resistance, and operation delay of the memory cell transistors can be prevented.

Next, the method for fabricating the semiconductor memory device according to the present embodiment will be explained with reference to FIG. 35.

Figure 35A:
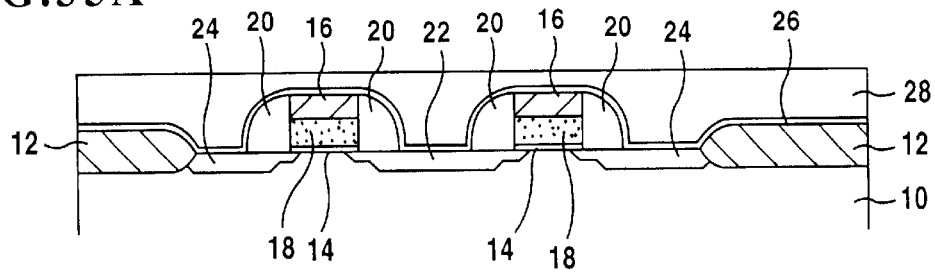
FIGS. 35A to 35E are sectional views of the semiconductor memory device according to the seventh embodiment of the present invention which show the method. embodiment of the present invention, which show the method.

Memory cell transistors covered with an insulating film 28 are formed on a silicon substrate 10 by the same steps of the method for fabricating the semiconductor memory device according to the first embodiment shown in FIGS. 2A to 2D (FIG. 35A). The device isolation film 12 has a pattern with the arms 72 of that of the semiconductor memory device according to the sixth embodiment.

Figure 35B:
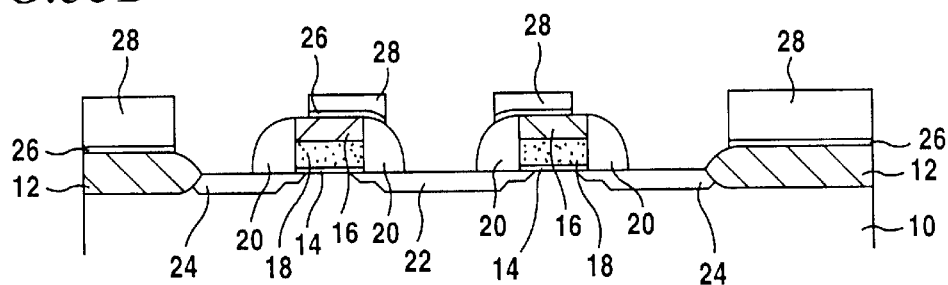

Then, the insulating film 28 and the silicon nitride film 26 are patterned to form openings for exposing the source diffused region 22 and openings for exposing a drain diffused region 24 (FIG. 35B). The openings for exposing the drain diffused region 24 are formed along the pattern of the arms 72.

Figure 35C:
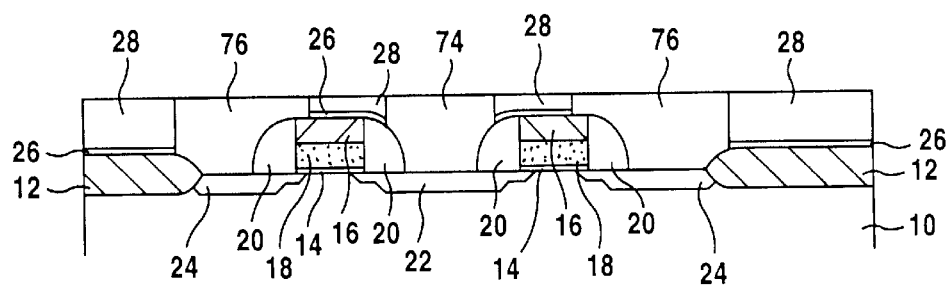

Then, the buried plugs 74 in the openings on the source diffused region 22, and buried plugs 76 in the openings on the drain diffused regions 24 are formed by the plug forming technique in which a film formed by, e.g., CVD is deposited etched back to form buries plugs (FIG. 35C). It is preferred that the buried plugs are formed of polycrystal silicon film or metal film having a low resistance value.

Figure 35D:
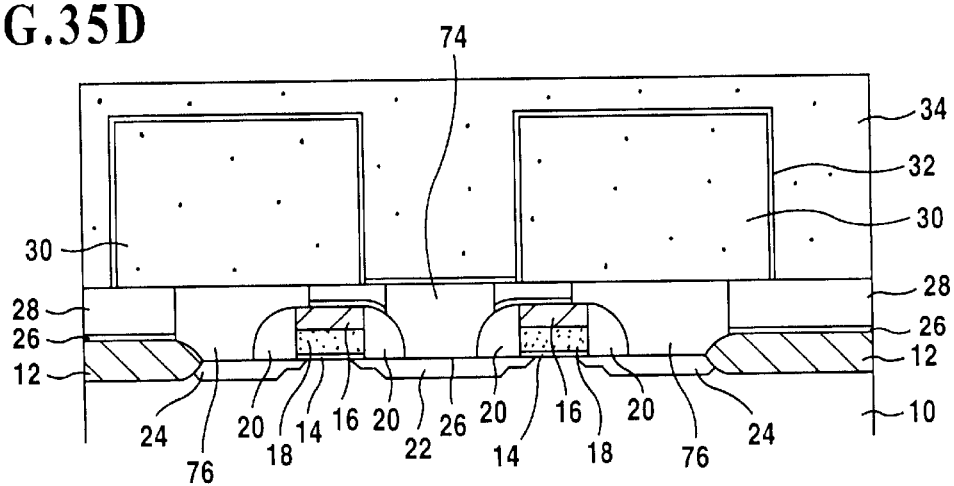
Figure 35E:
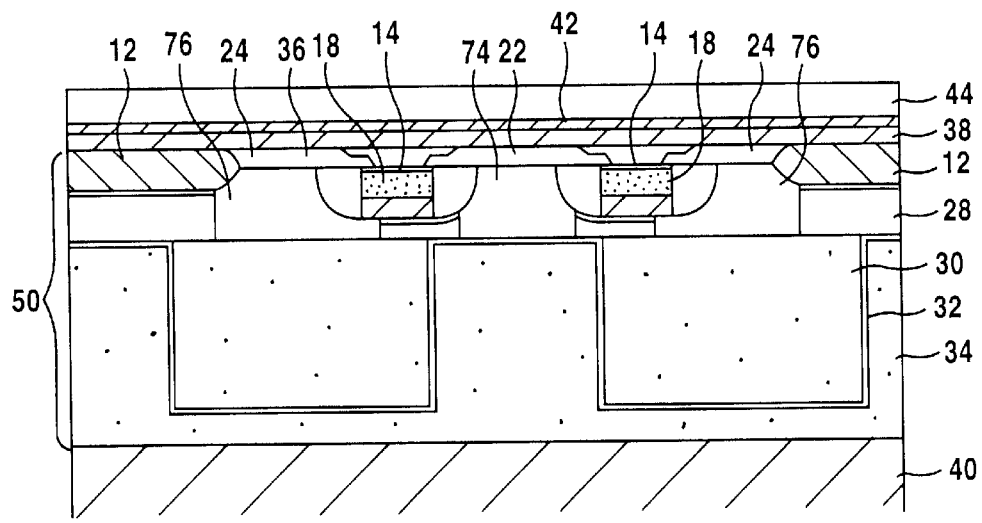

Then, capacitors comprising storage nodes 30, the capacitor dielectric film 32 and a cell plate 34 are formed by the same steps of the method for fabricating the semiconductor memory device according to the first embodiment (FIG. 35D and FIG. 35E). The storage nodes 30 are connected to the drain diffused region 24 through the buried plugs 76.

Next, a DRAM of SOI structure is formed by the same steps of the method for fabricating the semiconductor memory device according to the first embodiment (FIG. 33).

The semiconductor memory device is thus formed, whereby the buried plugs 74 for reducing the diffused region resistance of the arms 72 can be formed.

As described above, according to the present embodiment, the buried plugs 74 which line the device regions 80 from the source diffused region 22 to the arms 72 are formed, whereby even in a case that contact holes for bit lines are formed spaced from channel regions 66, diffused region resistance increases can be compensated. As a result, operation delay of the memory cell transistors can be prevented.

In the present embodiment, the buried plugs 74 are formed in the semiconductor memory device according to the sixth embodiment to thereby reduce a diffused region resistance, but it is not essential in the case that the buried plugs 74 are provided that the arms 72 are extended from the regions where the source diffused region 22 is formed.

Figure 36:
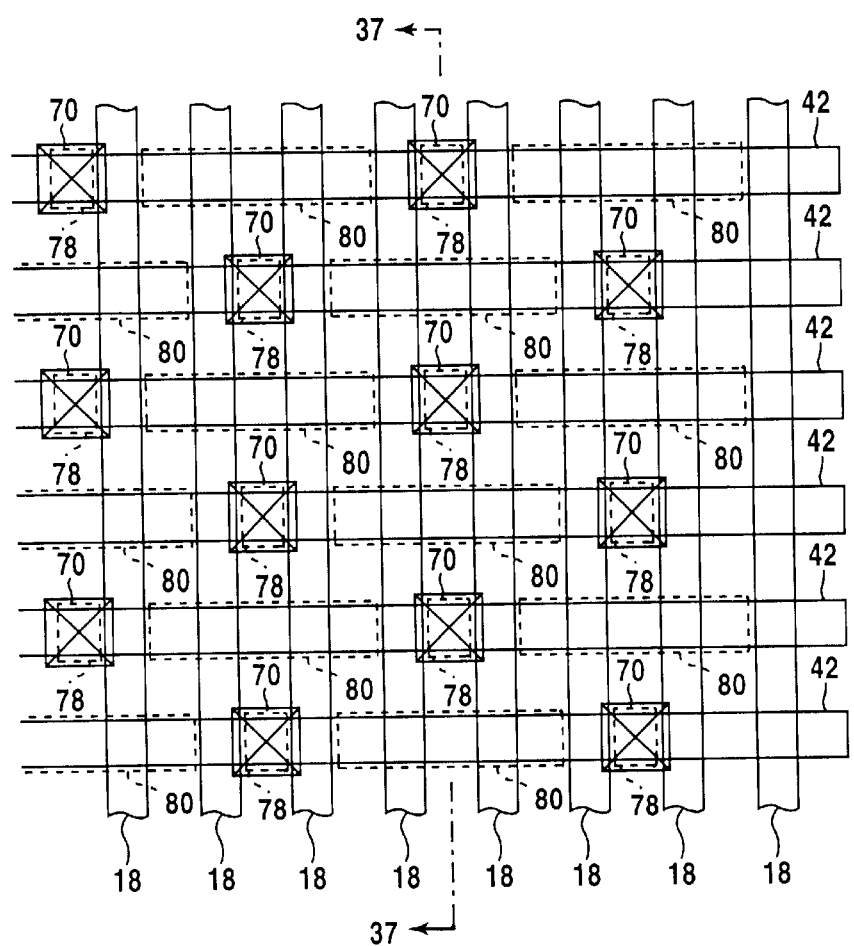
FIG. 36 is a diagrammatic sectional view of a variation of the semiconductor memory device according to the seventh embodiment of the present invention, which show a structure thereof.

As exemplified in the semiconductor memory device shown in FIG. 36, the device isolation film 12 may be formed so that isolated contact regions 78 are exposed in the regions where the contact holes for the bit lines 42 are formed.

Figure 37:
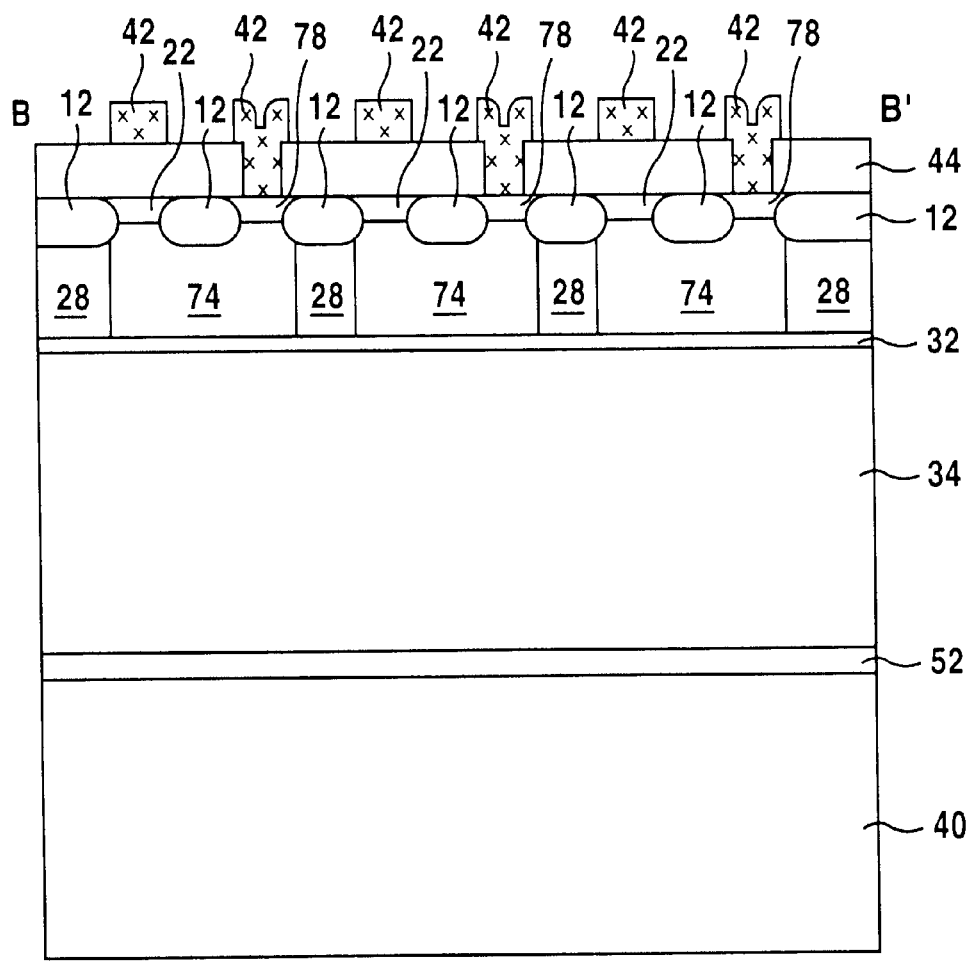
FIG. 37 is a diagrammatic sectional view of the semiconductor memory device of FIG. 36 along the 37—37 part.

In this case, the contact regions 78 and the device regions 80 are isolated by the device isolation film 12, but the source diffused region 22 and the contact regions 78 are connected with each other by the buried plugs 74 (FIG. 37). The memory cells can be formed by the same dimensions as that of the semiconductor memory device according to the sixth embodiment.

[An Eight Embodiment]

The method for fabricating the semiconductor memory device according to an eighth embodiment will be explained with reference to FIGS. 38 and 39.

Figure 38:
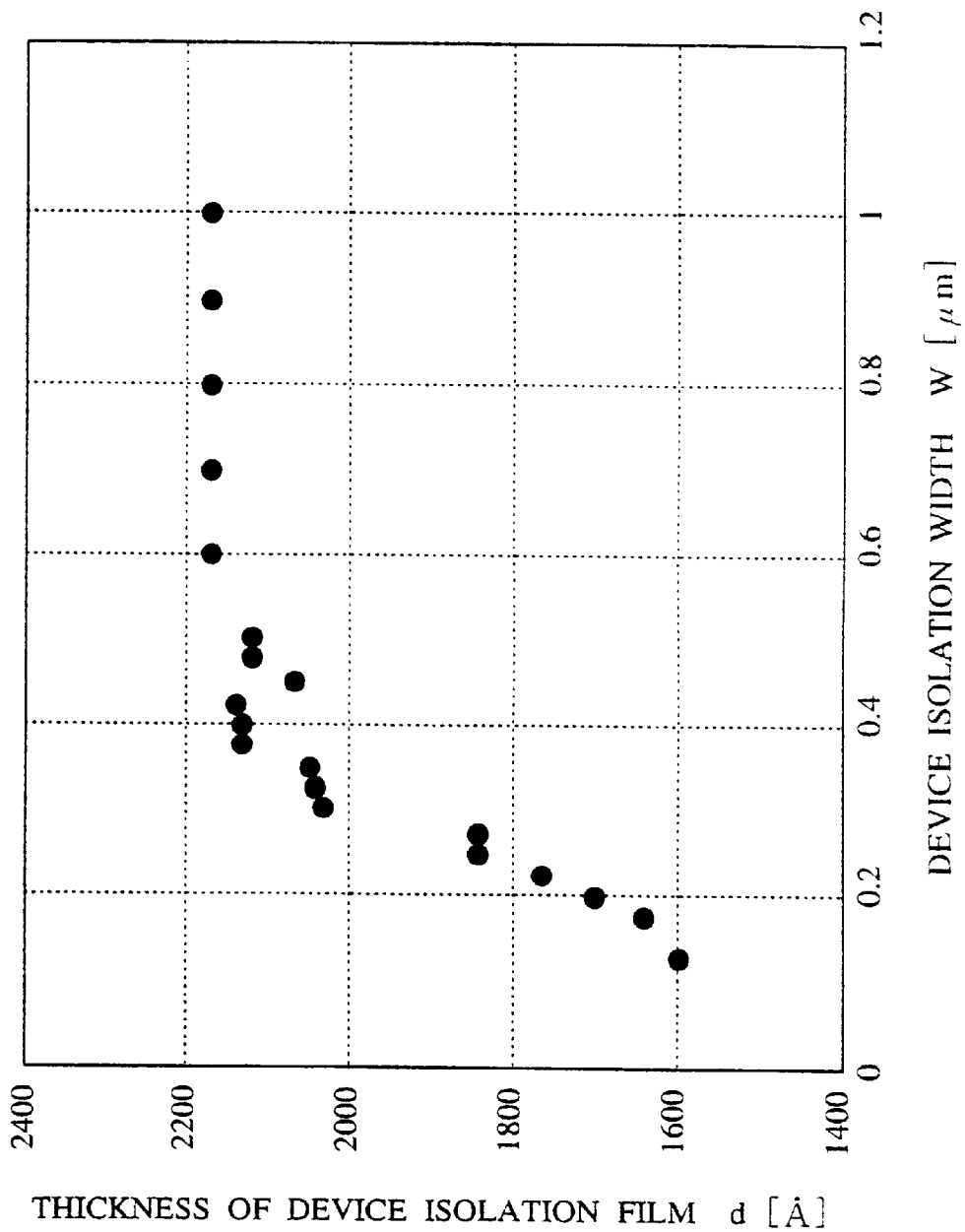
FIG. 38 is a view of relationships between thicknesses and device isolation widths of a device isolation film formed by LOCOS.

FIG. 38 is a view of relationships between thicknesses of a device isolation film and device isolation widths in a case that the device isolation film is formed by LOCOS. FIG. 39 is sectional views of the semiconductor memory device according to the eighth embodiment in the steps of the method for fabricating the same.

In the first to the fourth embodiments, the sixth embodiment and the seventh embodiment, the polishing of the device isolation film 12 is stopped by using the device isolation film 12 as the stopper.

The film thickness of the device isolation film, however, tends to become thinner as the device isolation width decreases as exemplified in FIG. 38.

In a case that the silicon oxide film is formed by thermal oxidation, the silicon of the substrate reacts with oxygen to form oxide film. The formed silicon oxide film is buried by about 45% of a total film thickness thereof in the silicon substrate. Depending on a film thickness of the silicon oxide film, a part of the silicon oxide film, which is buried in the silicon substrate, accordingly has a different thickness.

Thus, in one silicon substrate, when the device isolation width varies, the film thickness of the formed device isolation film varies in accordance with a device isolation width, and concurrently the film thickness of a part of the device isolation film buried in the silicon substrate varies.

In this case, by polishing the silicon substrate at the backside thereof using the device isolation film as the stopper, the polishing is stopped when a maximum film thickness of the device isolation film is exposed, and in regions having thin device isolation film thicknesses, the perfect device isolation which is an advantage of the SOI structure cannot be achieved.

To make film thicknesses of the formed device isolation film uniform, device isolation films are formed in respective regions having different device isolation widths is considered, but the device isolation step by LOCOS is repeated several times, which adds to the number of steps and to fabrication costs. Regions of different device isolation widths must be divided, which increases the workload to pattern design.

The method for fabricating the semiconductor memory device according to the present embodiment, can solve the above-described disadvantage caused by different device isolation film thicknesses without the necessity of adding a large number of steps.

The method for fabricating the semiconductor memory device according to the present embodiment will be explained with reference to FIG. 39.

Figure 39A:
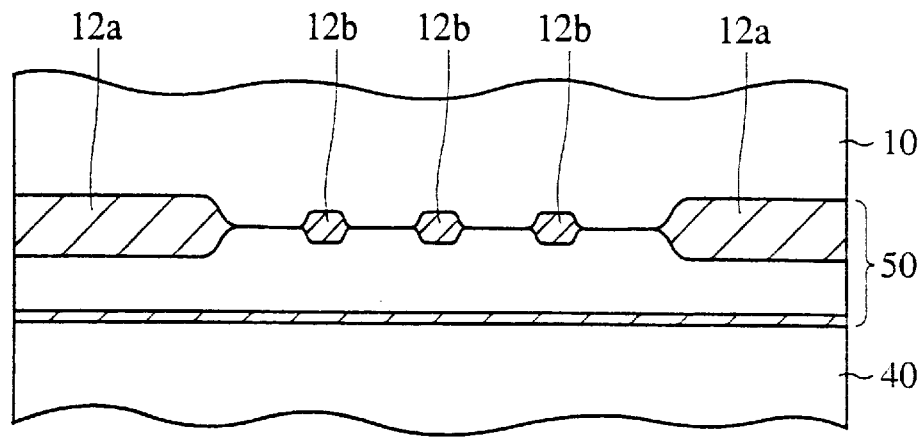
FIGS. 39A to 39D are sectional views of the semiconductor memory device according to an eighth embodiment of the present invention, which show the method.

First, a silicon substrate 10 with a device region 50 formed on is adhered to a support substrate 40 (FIG. 39A). Device isolation films 12a, 12b are formed on the surface of the silicon substrate 10, but due to different device isolation widths, the device isolation film 12 is thicker, and the device isolation film 12b is thinner.

Such device isolation film difference is found in, e.g., the usual memory regions. That is, usually memory cells are arranged in a matrix in small regions called cell arrays, and a number of the cell arrays are assembled to form a total memory region. A device isolation width between the memory cells is usually smaller than a device isolation width between the cell arrays, and accordingly the device isolation film between the memory cells is thinner, and the device isolation film between the memory arrays is thicker.

Figure 39B:
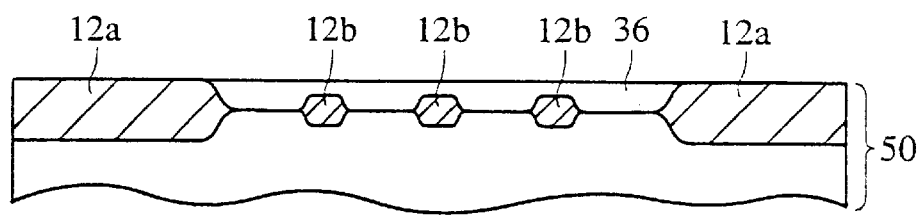

Then, the substrate shown in FIG. 39A is polished at the side thereof which is nearer to the silicon substrate 10 with the device isolation film 12a as the stopper, whereby the polishing is stopped when the device isolation film 12a is exposed (FIG. 39B). At this time, the device isolation is perfect in regions defined by the device isolation film 12a, but in regions defined by the device isolation film 12b the device isolation is not perfect.

Figure 39C:
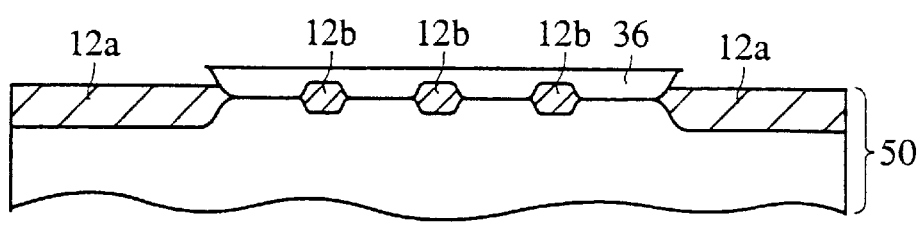

Subsequently the device isolation film 12a is etched by a pre-measured film thickness difference between the device isolation film 12a and the device isolation film 12b. The device isolation film 12a is etched by wet etching using, e.g., a hydrofluoric acid solution (FIG. 39C).

Figure 39D:
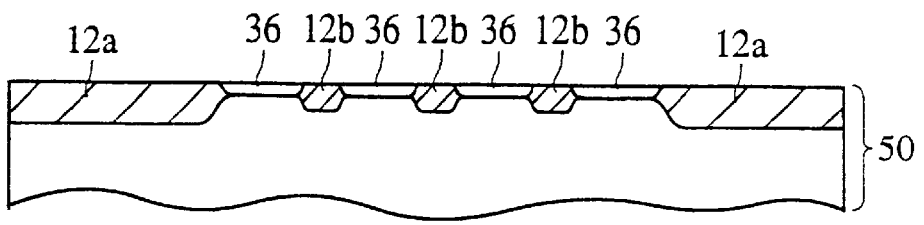

Then, a conductor layer 36 is again polished with the device isolation film 12a and the device isolation film 12b as the stopper, whereby the polishing is stopped when the device isolation films 12a, 12b are exposed. The conductor layer 36 is perfectly isolated by the device isolation films 12a, 12b (FIG. 39D).

As described above, according to the present embodiment, even in a case that the device isolation film has different thicknesses in regions, the polishing can be conducted down to the surface of the device isolation film, whereby the perfect device isolation, which is an advantage of SOI structure can be achieved.

The perfect device isolation can be formed by only etching the device isolation film, which can greatly reduce the number of fabrication steps and the cost increase.

What is claimed is:

1. A semiconductor memory device comprising:
a device layer including:
a silicon layer having a first diffused region and a second diffused region formed therein and having substantially flat surfaces, said silicon layer defining a first side and a second side;
a gate electrode formed only on said first side of the silicon layer between the first diffused region and the second diffused region interposing a gate insulating film between the gate electrode and the silicon layer;
a contact electrode formed on said first side of the silicon layer and connected to the second diffused region; and
a capacitor formed only on said first side of the silicon layer and having a storage electrode connected to the first diffused region;
a bit line formed on said second side of the silicon layer and electrically connected to the second diffused region via the contact electrode; and
a support substrate formed on said first side of the silicon layer for supporting the device layer interposing an insulating film between the support substrate and the device layer.

2. A semiconductor memory device according to claim 1, wherein
a connection surface of the storage electrode, which is connected to the first diffused region, is substantially parallel with a surface of the storage electrode.

3. A semiconductor memory device according to claim 1, further comprising:
a wiring layer formed on said second side of the silicon layer and electrically connected to a region of the silicon layer between the first and the second diffused regions.

4. A semiconductor memory device according to claim 1, wherein
the bit line is electrically connected to a region of the silicon layer between the first and the second diffused regions.

* * * * *